United States Patent
Yang et al.

(10) Patent No.: US 11,799,700 B1
(45) Date of Patent: Oct. 24, 2023

(54) DECODING MULTI-LEVEL CODED (MLC) SYSTEMS

(71) Applicant: QUALCOMM Incorporated, San Diego, CA (US)

(72) Inventors: Wei Yang, San Diego, CA (US); Jing Jiang, San Diego, CA (US); Jae Won Yoo, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/823,935

(22) Filed: Aug. 31, 2022

(51) Int. Cl.
*H04L 25/49* (2006.01)
*H04L 1/00* (2006.01)
*H03M 5/20* (2006.01)

(52) U.S. Cl.
CPC .......... *H04L 25/4917* (2013.01); *H03M 5/20* (2013.01); *H04L 1/0058* (2013.01)

(58) Field of Classification Search
CPC ... H04L 25/4917; H04L 25/49; H04L 1/0047; H04L 1/0048; H04L 1/0054; H04L 1/0055; H04L 1/0058–0066; H03M 5/20; H03M 13/2957
See application file for complete search history.

(56) References Cited

U.S. PATENT DOCUMENTS

| | | | | |
|---|---|---|---|---|
| 7,860,194 B2 * | 12/2010 | Kim | ............. | H04L 1/0066 714/780 |
| 7,885,367 B2 * | 2/2011 | Nishimura | ............. | H04L 7/048 375/357 |
| 8,135,082 B2 * | 3/2012 | Choi | ............. | H04L 1/0071 375/264 |
| 8,238,488 B1 * | 8/2012 | Lee | ............. | H04L 25/03331 375/262 |
| 8,411,806 B1 * | 4/2013 | Lee | ............. | H04L 25/03891 375/349 |
| 8,699,607 B2 * | 4/2014 | Seller | ............. | H04L 27/26524 375/267 |
| 8,792,594 B2 * | 7/2014 | Vojcic | ............. | H03M 13/1515 375/348 |
| 8,943,384 B2 * | 1/2015 | Sridhara | ............. | H03M 13/6577 714/763 |
| 8,958,375 B2 * | 2/2015 | Watson | ............. | H04L 1/0083 370/476 |
| 8,989,299 B2 * | 3/2015 | Zhou | ............. | H04L 25/03898 375/296 |
| 9,191,080 B2 * | 11/2015 | Yokomakura | ............. | H04B 7/0413 |

(Continued)

*Primary Examiner* — James M Perez
(74) *Attorney, Agent, or Firm* — Procopio, Cory, Hargreaves & Savitch

(57) ABSTRACT

Apparatus, methods, and computer program products for decoding are provided. An example method may include receiving a communication from a second network entity via a channel, where the communication is encoded based on multi-level coding associated with at least a first coding level and a second coding level, and where the first coding level is associated with a first set of bits and the second coding level is associated with a second set of bits. The example method may further include means for generating a first estimate of a first LLR associated with the first coding level, a second estimate of a second LLR associated with the second coding level, and auxiliary information including a third estimate of a third LLR based on the first set of bits and the second set of bits.

22 Claims, 12 Drawing Sheets

(56) References Cited

U.S. PATENT DOCUMENTS

| | | | |
|---|---|---|---|
| 9,191,151 B2 * | 11/2015 | Luby | H04L 65/70 |
| 9,209,934 B2 * | 12/2015 | Luby | H03M 13/05 |
| 9,253,233 B2 * | 2/2016 | Luby | H04L 67/02 |
| 9,294,226 B2 * | 3/2016 | Luby | H04L 1/0057 |
| 9,380,096 B2 * | 6/2016 | Luby | H04N 21/23406 |
| 9,386,064 B2 * | 7/2016 | Luby | H04L 65/764 |
| 9,419,749 B2 * | 8/2016 | Luby | H04L 1/0041 |
| 9,432,433 B2 * | 8/2016 | Luby | H04L 65/75 |
| 9,473,332 B2 * | 10/2016 | Bajcsy | H04L 27/2654 |
| 9,491,026 B2 * | 11/2016 | Murakami | H04L 27/0008 |
| 9,596,447 B2 * | 3/2017 | Chen | H04N 21/85406 |
| 9,602,802 B2 * | 3/2017 | Chen | H04N 21/816 |
| 9,628,536 B2 * | 4/2017 | Luby | H04N 21/234327 |
| 9,660,763 B2 * | 5/2017 | Luby | H04L 1/0065 |
| 9,692,630 B2 * | 6/2017 | Qi | H04L 27/2649 |
| 9,876,607 B2 * | 1/2018 | Luby | H03M 13/3761 |
| 9,917,874 B2 * | 3/2018 | Luby | H04L 65/756 |
| 10,135,649 B2 * | 11/2018 | Soriano | H04L 1/0058 |
| 10,312,937 B2 * | 6/2019 | Loncke | H03M 13/6566 |
| 10,396,819 B1 * | 8/2019 | Myung | H03M 13/253 |
| 10,536,196 B2 * | 1/2020 | Geng | H04B 7/0413 |
| 10,749,633 B2 * | 8/2020 | Xu | H03M 13/6362 |
| 10,778,371 B2 * | 9/2020 | Loncke | G06F 11/3006 |
| 10,855,736 B2 * | 12/2020 | Luby | H04N 21/23106 |
| 10,868,569 B2 * | 12/2020 | Sadiq | H03M 13/612 |
| 10,944,517 B2 * | 3/2021 | Li | H04L 1/1819 |
| 10,965,360 B2 * | 3/2021 | Schenk | H04B 7/0639 |
| 11,201,775 B2 * | 12/2021 | Lopez | H04B 5/0031 |
| 11,218,352 B2 * | 1/2022 | Park | H04L 1/0068 |
| 11,362,769 B2 * | 6/2022 | Xu | H04L 1/1819 |
| 11,398,936 B2 * | 7/2022 | Martinez | H04L 5/0023 |
| 11,411,678 B2 * | 8/2022 | Chen | H04L 1/0057 |
| 11,469,854 B2 * | 10/2022 | Wu | H03M 13/251 |
| 11,477,253 B2 * | 10/2022 | Luby | H04N 21/23406 |
| 11,621,726 B1 * | 4/2023 | Pan | H03M 13/2906 714/755 |
| 11,646,828 B2 * | 5/2023 | Li | H04L 1/1812 370/329 |
| 2008/0016425 A1 * | 1/2008 | Khan | H03M 13/2957 714/755 |
| 2010/0034323 A1 * | 2/2010 | Stoye | H04L 1/0045 375/341 |
| 2010/0067596 A1 * | 3/2010 | Park | H04L 25/067 375/262 |
| 2010/0316151 A1 * | 12/2010 | Fukawa | H04L 25/03171 375/260 |
| 2014/0153625 A1 * | 6/2014 | Vojcic | G06F 11/1625 375/340 |
| 2014/0153628 A1 * | 6/2014 | Vojcic | H03M 13/612 375/227 |
| 2015/0341053 A1 * | 11/2015 | Kim | H03M 13/1102 714/776 |
| 2015/0341054 A1 * | 11/2015 | Myung | H03M 13/255 714/776 |
| 2016/0344415 A1 * | 11/2016 | Kim | H04L 1/0071 |
| 2016/0344423 A1 * | 11/2016 | Kim | H03M 13/255 |
| 2017/0262334 A1 * | 9/2017 | Uchikawa | G11C 16/04 |
| 2018/0069734 A1 * | 3/2018 | Soriano | H04L 1/0041 |
| 2018/0123734 A1 * | 5/2018 | Loncke | H04L 1/0052 |
| 2018/0323804 A1 * | 11/2018 | Sadiq | H04L 1/0041 |
| 2019/0007255 A1 * | 1/2019 | Limberg | H04L 27/26524 |
| 2019/0305801 A1 * | 10/2019 | Kim | H03M 13/253 |
| 2019/0334755 A1 * | 10/2019 | Limberg | H04L 27/28 |
| 2021/0152290 A1 * | 5/2021 | Li | H04L 1/1812 |
| 2021/0152412 A1 * | 5/2021 | Park | H04L 27/26 |
| 2022/0312250 A1 * | 9/2022 | Elshafie | H04L 1/0026 |
| 2022/0353203 A1 * | 11/2022 | Rico Alvarino | H04L 49/90 |
| 2023/0084537 A1 * | 3/2023 | Pan | H03M 13/2906 714/755 |

* cited by examiner

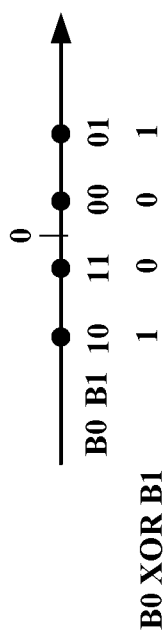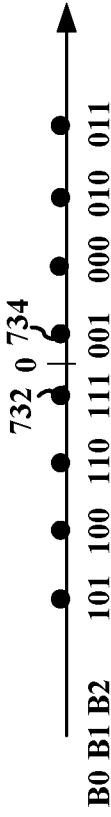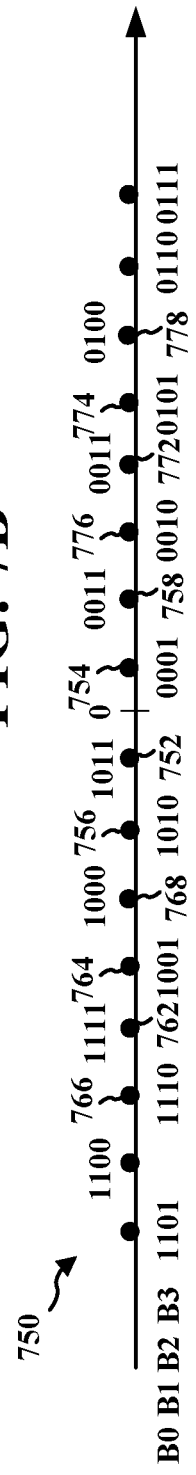
FIG. 7A
FIG. 7B
FIG. 7C

DECODING MULTI-LEVEL CODED (MLC) SYSTEMS

TECHNICAL FIELD

The present disclosure relates generally to communication systems, and more particularly, to communication systems with multi-level coded (MLC).

INTRODUCTION

Wireless communication systems are widely deployed to provide various telecommunication services such as telephony, video, data, messaging, and broadcasts. Typical wireless communication systems may employ multiple-access technologies capable of supporting communication with multiple users by sharing available system resources. Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

These multiple access technologies have been adopted in various telecommunication standards to provide a common protocol that enables different wireless devices to communicate on a municipal, national, regional, and even global level. An example telecommunication standard is 5G New Radio (NR). 5G NR is part of a continuous mobile broadband evolution promulgated by Third Generation Partnership Project (3GPP) to meet new requirements associated with latency, reliability, security, scalability (e.g., with Internet of Things (IoT)), and other requirements. 5G NR includes services associated with enhanced mobile broadband (eMBB), massive machine type communications (mMTC), and ultra-reliable low latency communications (URLLC). Some aspects of 5G NR may be based on the 4G Long Term Evolution (LTE) standard. There exists a need for further improvements in 5G NR technology. These improvements may also be applicable to other multi-access technologies and the telecommunication standards that employ these technologies.

BRIEF SUMMARY

The following presents a simplified summary of one or more aspects in order to provide a basic understanding of such aspects. This summary is not an extensive overview of all contemplated aspects. This summary neither identifies key or critical elements of all aspects nor delineates the scope of any or all aspects. Its sole purpose is to present some concepts of one or more aspects in a simplified form as a prelude to the more detailed description that is presented later.

In an aspect of the disclosure, a method, a computer-readable medium, and an apparatus at a first network entity are provided. The apparatus may include a memory and at least one processor coupled to the memory. The memory and the at least one processor coupled to the memory may be configured to receive a communication from a second network entity via a channel, where the communication is encoded based on multi-level coding associated with at least a first coding level and a second coding level, and where the first coding level is associated with a first set of bits and the second coding level is associated with a second set of bits. The memory and the at least one processor coupled to the memory may be further configured to generate a first estimate of a first log-likelihood ratio (LLR) associated with the first coding level, a second estimate of a second LLR associated with the second coding level, and auxiliary information including a third estimate of a third LLR based on the first set of bits and the second set of bits. The memory and the at least one processor coupled to the memory may be further configured to decode the first set of bits based on the first estimate of the first LLR. The memory and the at least one processor coupled to the memory may be further configured to generate a fourth estimate of the second LLR based on the decoded first set of bits, the second estimate of the second LLR, and the auxiliary information. The memory and the at least one processor coupled to the memory may be further configured to decode the second set of bits based on the fourth estimate of the second LLR. In some aspects, the third estimate of the third LLR is based on an exclusive disjunction (XOR) of a first one or more bits in the first set of bits and a second one or more bits in the second set of bits.

To the accomplishment of the foregoing and related ends, the one or more aspects comprise the features hereinafter fully described and particularly pointed out in the claims. The following description and the drawings set forth in detail certain illustrative features of the one or more aspects. These features are indicative, however, of but a few of the various ways in which the principles of various aspects may be employed.

BRIEF DESCRIPTION OF THE DRAWINGS

FIG. 7A is a diagram illustrating example bits.

FIG. 7B is a diagram illustrating example bits.

FIG. 7C is a diagram illustrating example bits.

DETAILED DESCRIPTION

Figure 1:
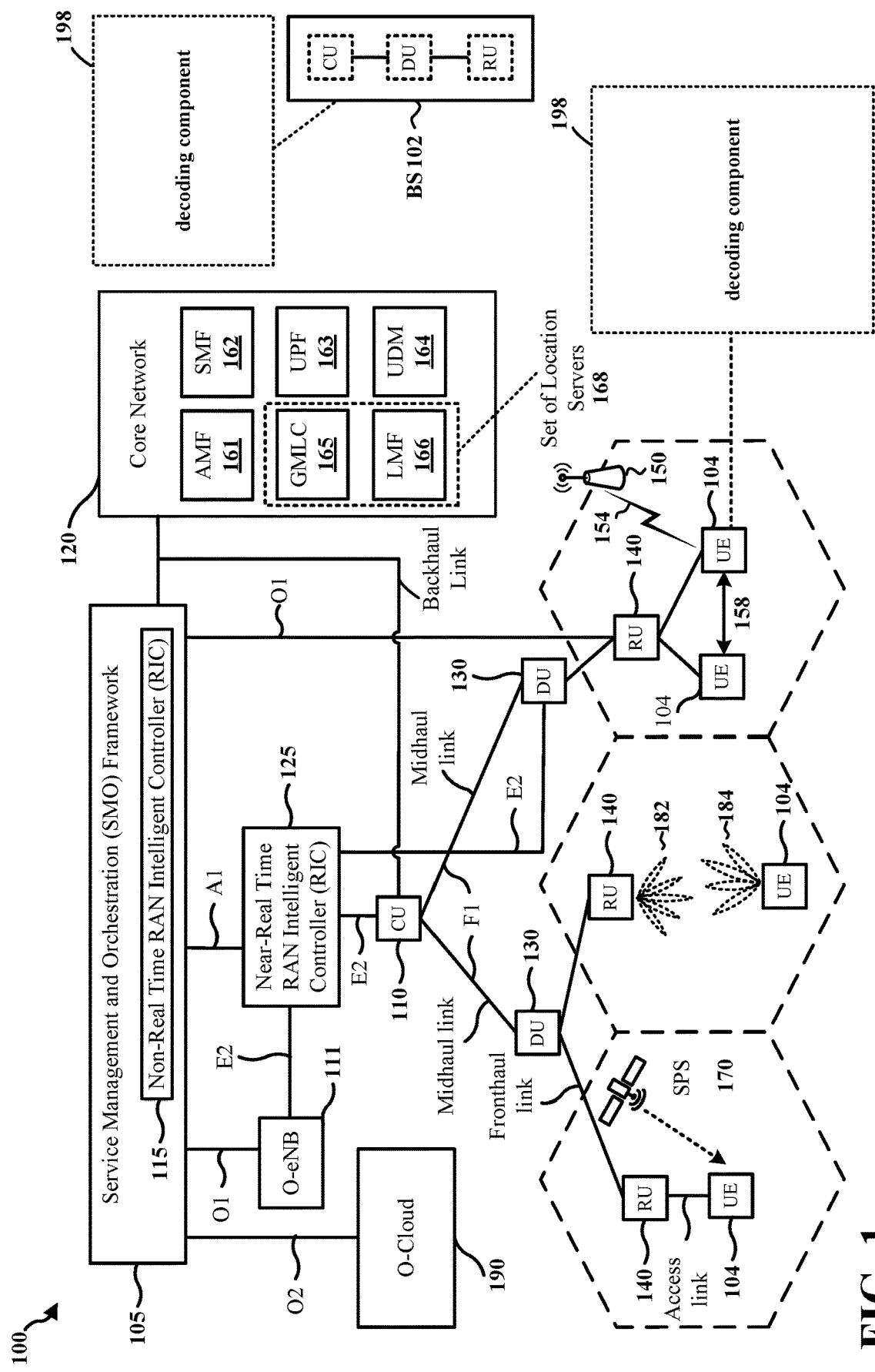
FIG. 1 is a diagram illustrating an example of a wireless communications system and an access network.

The detailed description set forth below in connection with the drawings describes various configurations and does not represent the only configurations in which the concepts described herein may be practiced. The detailed description includes specific details for the purpose of providing a thorough understanding of various concepts. However, these concepts may be practiced without these specific details. In some instances, well known structures and components are shown in block diagram form in order to avoid obscuring such concepts.

Several aspects of telecommunication systems are presented with reference to various apparatus and methods. These apparatus and methods are described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software, whether referred to as software, firmware, middleware, microcode, hardware description language, or otherwise, shall be construed broadly to mean instructions, instruction sets, code, code segments, program code, programs, subprograms, software components, applications, software applications, software packages, routines, subroutines, objects, executables, threads of execution, procedures, functions, or any combination thereof.

Accordingly, in one or more example aspects, implementations, and/or use cases, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, such computer-readable media can comprise a random-access memory (RAM), a read-only memory (ROM), an electrically erasable programmable ROM (EEPROM), optical disk storage, magnetic disk storage, other magnetic storage devices, combinations of the types of computer-readable media, or any other medium that can be used to store computer executable code in the form of instructions or data structures that can be accessed by a computer.

While aspects, implementations, and/or use cases are described in this application by illustration to some examples, additional or different aspects, implementations and/or use cases may come about in many different arrangements and scenarios. Aspects, implementations, and/or use cases described herein may be implemented across many differing platform types, devices, systems, shapes, sizes, and packaging arrangements. For example, aspects, implementations, and/or use cases may come about via integrated chip implementations and other non-module-component based devices (e.g., end-user devices, vehicles, communication devices, computing devices, industrial equipment, retail/purchasing devices, medical devices, artificial intelligence (AI)-enabled devices, etc.). While some examples may or may not be specifically directed to use cases or applications, a wide assortment of applicability of described examples may occur. Aspects, implementations, and/or use cases may range a spectrum from chip-level or modular components to non-modular, non-chip-level implementations and further to aggregate, distributed, or original equipment manufacturer (OEM) devices or systems incorporating one or more techniques herein. In some practical settings, devices incorporating described aspects and features may also include additional components and features for implementation and practice of claimed and described aspect. For example, transmission and reception of wireless signals necessarily includes a number of components for analog and digital purposes (e.g., hardware components including antenna, RF-chains, power amplifiers, modulators, buffer, processor(s), interleaver, adders/summers, etc.). Techniques described herein may be practiced in a wide variety of devices, chip-level components, systems, distributed arrangements, aggregated or disaggregated components, end-user devices, etc. of varying sizes, shapes, and constitution.

Deployment of communication systems, such as 5G NR systems, may be arranged in multiple manners with various components or constituent parts. In a 5G NR system, or network, a network node, a network entity, a mobility element of a network, a radio access network (RAN) node, a core network node, a network element, or a network equipment, such as a base station (BS), or one or more units (or one or more components) performing base station functionality, may be implemented in an aggregated or disaggregated architecture. For example, a BS (such as a Node B (NB), evolved NB (eNB), NR BS, 5G NB, access point (AP), a transmit receive point (TRP), or a cell, etc.) may be implemented as an aggregated base station (also known as a standalone BS or a monolithic BS) or a disaggregated base station.

An aggregated base station may be configured to utilize a radio protocol stack that is physically or logically integrated within a single RAN node. A disaggregated base station may be configured to utilize a protocol stack that is physically or logically distributed among two or more units (such as one or more central or centralized units (CUs), one or more distributed units (DUs), or one or more radio units (RUs)). In some aspects, a CU may be implemented within a RAN node, and one or more DUs may be co-located with the CU, or alternatively, may be geographically or virtually distributed throughout one or multiple other RAN nodes. The DUs may be implemented to communicate with one or more RUs. Each of the CU, DU and RU can be implemented as virtual units, i.e., a virtual central unit (VCU), a virtual distributed unit (VDU), or a virtual radio unit (VRU).

Base station operation or network design may consider aggregation characteristics of base station functionality. For example, disaggregated base stations may be utilized in an integrated access backhaul (IAB) network, an open radio access network (O-RAN (such as the network configuration sponsored by the O-RAN Alliance)), or a virtualized radio access network (vRAN, also known as a cloud radio access network (C-RAN)). Disaggregation may include distributing functionality across two or more units at various physical locations, as well as distributing functionality for at least one unit virtually, which can enable flexibility in network design. The various units of the disaggregated base station, or disaggregated RAN architecture, can be configured for wired or wireless communication with at least one other unit.

FIG. 1 is a diagram 100 illustrating an example of a wireless communications system and an access network. The illustrated wireless communications system includes a disaggregated base station architecture. The disaggregated base station architecture may include one or more CUs 110 that can communicate directly with a core network 120 via a backhaul link, or indirectly with the core network 120 through one or more disaggregated base station units (such as a Near-Real Time (Near-RT) RAN Intelligent Controller (RIC) 125 via an E2 link, or a Non-Real Time (Non-RT) RIC 115 associated with a Service Management and Orchestration (SMO) Framework 105, or both). A CU 110 may communicate with one or more DUs 130 via respective midhaul links, such as an F1 interface. The DUs 130 may communicate with one or more RUs 140 via respective fronthaul links. The RUs 140 may communicate with respective UEs 104 via one or more radio frequency (RF) access links. In some implementations, the UE 104 may be simultaneously served by multiple RUs 140.

Each of the units, i.e., the CUs 110, the DUs 130, the RUs 140, as well as the Near-RT RICs 125, the Non-RT RICs 115, and the SMO Framework 105, may include one or more interfaces or be coupled to one or more interfaces configured to receive or to transmit signals, data, or information (collectively, signals) via a wired or wireless transmission medium. Each of the units, or an associated processor or controller providing instructions to the communication interfaces of the units, can be configured to communicate with one or more of the other units via the transmission medium. For example, the units can include a wired interface configured to receive or to transmit signals over a wired transmission medium to one or more of the other units. Additionally, the units can include a wireless interface, which may include a receiver, a transmitter, or a transceiver (such as an RF transceiver), configured to receive or to transmit signals, or both, over a wireless transmission medium to one or more of the other units.

In some aspects, the CU 110 may host one or more higher layer control functions. Such control functions can include radio resource control (RRC), packet data convergence protocol (PDCP), service data adaptation protocol (SDAP), or the like. Each control function can be implemented with an interface configured to communicate signals with other control functions hosted by the CU 110. The CU 110 may be configured to handle user plane functionality (i.e., Central Unit-User Plane (CU-UP)), control plane functionality (i.e., Central Unit-Control Plane (CU-CP)), or a combination thereof. In some implementations, the CU 110 can be logically split into one or more CU-UP units and one or more CU-CP units. The CU-UP unit can communicate bidirectionally with the CU-CP unit via an interface, such as an E1 interface when implemented in an O-RAN configuration. The CU 110 can be implemented to communicate with the DU 130, as necessary, for network control and signaling.

The DU 130 may correspond to a logical unit that includes one or more base station functions to control the operation of one or more RUs 140. In some aspects, the DU 130 may host one or more of a radio link control (RLC) layer, a medium access control (MAC) layer, and one or more high physical (PHY) layers (such as modules for forward error correction (FEC) encoding and decoding, scrambling, modulation, demodulation, or the like) depending on a functional split, such as those defined by 3GPP. In some aspects, the DU 130 may further host one or more low PHY layers. Each layer (or module) can be implemented with an interface configured to communicate signals with other layers (and modules) hosted by the DU 130, or with the control functions hosted by the CU 110.

Lower-layer functionality can be implemented by one or more RUs 140. In some deployments, an RU 140, controlled by a DU 130, may correspond to a logical node that hosts RF processing functions, or low-PHY layer functions (such as performing fast Fourier transform (FFT), inverse FFT (iFFT), digital beamforming, physical random access channel (PRACH) extraction and filtering, or the like), or both, based on the functional split, such as a lower layer functional split. In such an architecture, the RU(s) 140 can be implemented to handle over the air (OTA) communication with one or more UEs 104. In some implementations, real-time and non-real-time aspects of control and user plane communication with the RU(s) 140 can be controlled by the corresponding DU 130. In some scenarios, this configuration can enable the DU(s) 130 and the CU 110 to be implemented in a cloud-based RAN architecture, such as a vRAN architecture.

The SMO Framework 105 may be configured to support RAN deployment and provisioning of non-virtualized and virtualized network elements. For non-virtualized network elements, the SMO Framework 105 may be configured to support the deployment of dedicated physical resources for RAN coverage requirements that may be managed via an operations and maintenance interface (such as an O1 interface). For virtualized network elements, the SMO Framework 105 may be configured to interact with a cloud computing platform (such as an open cloud (O-Cloud) 190) to perform network element life cycle management (such as to instantiate virtualized network elements) via a cloud computing platform interface (such as an O2 interface). Such virtualized network elements can include, but are not limited to, CUs 110, DUs 130, RUs 140 and Near-RT RICs 125. In some implementations, the SMO Framework 105 can communicate with a hardware aspect of a 4G RAN, such as an open eNB (O-eNB) 111, via an O1 interface. Additionally, in some implementations, the SMO Framework 105 can communicate directly with one or more RUs 140 via an O1 interface. The SMO Framework 105 also may include a Non-RT RIC 115 configured to support functionality of the SMO Framework 105.

The Non-RT RIC 115 may be configured to include a logical function that enables non-real-time control and optimization of RAN elements and resources, artificial intelligence (AI)/machine learning (ML) (AI/ML) workflows including model training and updates, or policy-based guidance of applications/features in the Near-RT RIC 125. The Non-RT RIC 115 may be coupled to or communicate with (such as via an A1 interface) the Near-RT RIC 125. The Near-RT RIC 125 may be configured to include a logical function that enables near-real-time control and optimization of RAN elements and resources via data collection and actions over an interface (such as via an E2 interface) connecting one or more CUs 110, one or more DUs 130, or both, as well as an O-eNB, with the Near-RT RIC 125.

In some implementations, to generate AI/ML models to be deployed in the Near-RT RIC 125, the Non-RT RIC 115 may receive parameters or external enrichment information from external servers. Such information may be utilized by the Near-RT RIC 125 and may be received at the SMO Framework 105 or the Non-RT RIC 115 from non-network data sources or from network functions. In some examples, the Non-RT RIC 115 or the Near-RT RIC 125 may be configured to tune RAN behavior or performance. For example, the Non-RT RIC 115 may monitor long-term trends and patterns for performance and employ AI/ML models to perform corrective actions through the SMO Framework 105 (such as reconfiguration via O1) or via creation of RAN management policies (such as A1 policies).

At least one of the CU 110, the DU 130, and the RU 140 may be referred to as a base station 102. Accordingly, a base station 102 may include one or more of the CU 110, the DU 130, and the RU 140 (each component indicated with dotted lines to signify that each component may or may not be included in the base station 102). The base station 102 provides an access point to the core network 120 for a UE 104. The base stations 102 may include macrocells (high power cellular base station) and/or small cells (low power cellular base station). The small cells include femtocells, picocells, and microcells. A network that includes both small cell and macrocells may be known as a heterogeneous network. A heterogeneous network may also include Home Evolved Node Bs (eNBs) (HeNBs), which may provide service to a restricted group known as a closed subscriber group (CSG). The communication links between the RUs 140 and the UEs 104 may include uplink (UL) (also referred to as reverse link) transmissions from a UE 104 to an RU 140 and/or downlink (DL) (also referred to as forward link) transmissions from an RU 140 to a UE 104. The communication links may use multiple-input and multiple-output (MIMO) antenna technology, including spatial multiplexing, beamforming, and/or transmit diversity. The communication links may be through one or more carriers. The base stations 102/UEs 104 may use spectrum up to Y MHz (e.g., 5, 10, 15, 20, 100, 400, etc. MHz) bandwidth per carrier allocated in a carrier aggregation of up to a total of Yx MHz (x component carriers) used for transmission in each direction. The carriers may or may not be adjacent to each other. Allocation of carriers may be asymmetric with respect to DL and UL (e.g., more or fewer carriers may be allocated for DL than for UL). The component carriers may include a primary component carrier and one or more secondary component carriers. A primary component carrier may be referred to as a primary cell (PCell) and a secondary component carrier may be referred to as a secondary cell (SCell).

Certain UEs 104 may communicate with each other using device-to-device (D2D) communication link 158. The D2D communication link 158 may use the DL/UL wireless wide area network (WWAN) spectrum. The D2D communication link 158 may use one or more sidelink channels, such as a physical sidelink broadcast channel (PSBCH), a physical sidelink discovery channel (PSDCH), a physical sidelink shared channel (PSSCH), and a physical sidelink control channel (PSCCH). D2D communication may be through a variety of wireless D2D communications systems, such as for example, Bluetooth, Wi-Fi based on the Institute of Electrical and Electronics Engineers (IEEE) 802.11 standard, LTE, or NR.

The wireless communications system may further include a Wi-Fi AP 150 in communication with UEs 104 (also referred to as Wi-Fi stations (STAs)) via communication link 154, e.g., in a 5 GHz unlicensed frequency spectrum or the like. When communicating in an unlicensed frequency spectrum, the UEs 104/AP 150 may perform a clear channel assessment (CCA) prior to communicating in order to determine whether the channel is available.

The electromagnetic spectrum is often subdivided, based on frequency/wavelength, into various classes, bands, channels, etc. In 5G NR, two initial operating bands have been identified as frequency range designations FR1 (410 MHz-7.125 GHz) and FR2 (24.25 GHz-52.6 GHz). Although a portion of FR1 is greater than 6 GHz, FR1 is often referred to (interchangeably) as a "sub-6 GHz" band in various documents and articles. A similar nomenclature issue sometimes occurs with regard to FR2, which is often referred to (interchangeably) as a "millimeter wave" band in documents and articles, despite being different from the extremely high frequency (EHF) band (30 GHz-300 GHz) which is identified by the International Telecommunications Union (ITU) as a "millimeter wave" band.

The frequencies between FR1 and FR2 are often referred to as mid-band frequencies. Recent 5G NR studies have identified an operating band for these mid-band frequencies as frequency range designation FR3 (7.125 GHz-24.25 GHz). Frequency bands falling within FR3 may inherit FR1 characteristics and/or FR2 characteristics, and thus may effectively extend features of FR1 and/or FR2 into mid-band frequencies. In addition, higher frequency bands are currently being explored to extend 5G NR operation beyond 52.6 GHz. For example, three higher operating bands have been identified as frequency range designations FR2-2 (52.6 GHz-71 GHz), FR4 (71 GHz-114.25 GHz), and FR5 (114.25 GHz-300 GHz). Each of these higher frequency bands falls within the EHF band.

With the above aspects in mind, unless specifically stated otherwise, the term "sub-6 GHz" or the like if used herein may broadly represent frequencies that may be less than 6 GHz, may be within FR1, or may include mid-band frequencies. Further, unless specifically stated otherwise, the term "millimeter wave" or the like if used herein may broadly represent frequencies that may include mid-band frequencies, may be within FR2, FR4, FR2-2, and/or FR5, or may be within the EHF band.

The base station 102 and the UE 104 may each include a plurality of antennas, such as antenna elements, antenna panels, and/or antenna arrays to facilitate beamforming. The base station 102 may transmit a beamformed signal 182 to the UE 104 in one or more transmit directions. The UE 104 may receive the beamformed signal from the base station 102 in one or more receive directions. The UE 104 may also transmit a beamformed signal 184 to the base station 102 in one or more transmit directions. The base station 102 may receive the beamformed signal from the UE 104 in one or more receive directions. The base station 102/UE 104 may perform beam training to determine the best receive and transmit directions for each of the base station 102/UE 104. The transmit and receive directions for the base station 102 may or may not be the same. The transmit and receive directions for the UE 104 may or may not be the same.

The base station 102 may include and/or be referred to as a gNB, Node B, eNB, an access point, a base transceiver station, a radio base station, a radio transceiver, a transceiver function, a basic service set (BSS), an extended service set (ESS), a TRP, network node, network entity, network equipment, or some other suitable terminology. The base station 102 can be implemented as an integrated access and backhaul (IAB) node, a relay node, a sidelink node, an aggregated (monolithic) base station with a baseband unit (BBU)

(including a CU and a DU) and an RU, or as a disaggregated base station including one or more of a CU, a DU, and/or an RU.

The core network 120 may include an Access and Mobility Management Function (AMF) 161, a Session Management Function (SMF) 162, a User Plane Function (UPF) 163, a Unified Data Management (UDM) 164, one or more location servers 168, and other functional entities. The AMF 161 is the control node that processes the signaling between the UEs 104 and the core network 120. The AMF 161 supports registration management, connection management, mobility management, and other functions. The SMF 162 supports session management and other functions. The UPF 163 supports packet routing, packet forwarding, and other functions. The UDM 164 supports the generation of authentication and key agreement (AKA) credentials, user identification handling, access authorization, and subscription management. The one or more location servers 168 are illustrated as including a Gateway Mobile Location Center (GMLC) 165 and a Location Management Function (LMF) 166. However, generally, the one or more location servers 168 may include one or more location/positioning servers, which may include one or more of the GMLC 165, the LMF 166, a position determination entity (PDE), a serving mobile location center (SMLC), a mobile positioning center (MPC), or the like. The GMLC 165 and the LMF 166 support UE location services. The GMLC 165 provides an interface for clients/applications (e.g., emergency services) for accessing UE positioning information. The LMF 166 receives measurements and assistance information from the NG-RAN and the UE 104 via the AMF 161 to compute the position of the UE 104. The NG-RAN may utilize one or more positioning methods in order to determine the position of the UE 104. Positioning the UE 104 may involve signal measurements, a position estimate, and an optional velocity computation based on the measurements. The signal measurements may be made by the UE 104 and/or the serving base station 102. The signals measured may be based on one or more of a satellite positioning system (SPS) 170 (e.g., one or more of a Global Navigation Satellite System (GNSS), global position system (GPS), non-terrestrial network (NTN), or other satellite position/location system), LTE signals, wireless local area network (WLAN) signals, Bluetooth signals, a terrestrial beacon system (TBS), sensor-based information (e.g., barometric pressure sensor, motion sensor), NR enhanced cell ID (NR E-CID) methods, NR signals (e.g., multi-round trip time (Multi-RTT), DL angle-of-departure (DL-AoD), DL time difference of arrival (DL-TDOA), UL time difference of arrival (UL-TDOA), and UL angle-of-arrival (UL-AoA) positioning), and/or other systems/signals/sensors.

Examples of UEs 104 include a cellular phone, a smart phone, a session initiation protocol (SIP) phone, a laptop, a personal digital assistant (PDA), a satellite radio, a global positioning system, a multimedia device, a video device, a digital audio player (e.g., MP3 player), a camera, a game console, a tablet, a smart device, a wearable device, a vehicle, an electric meter, a gas pump, a large or small kitchen appliance, a healthcare device, an implant, a sensor/actuator, a display, or any other similar functioning device. Some of the UEs 104 may be referred to as IoT devices (e.g., parking meter, gas pump, toaster, vehicles, heart monitor, etc.). The UE 104 may also be referred to as a station, a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology. In some scenarios, the term UE may also apply to one or more companion devices such as in a device constellation arrangement. One or more of these devices may collectively access the network and/or individually access the network.

Referring again to FIG. 1, in some aspects, the UE 104 may include a decoding component 198. In some aspects, the decoding component 198 may be configured to receive a communication from a second network entity via a channel, where the communication is encoded based on multi-level coding associated with at least a first coding level and a second coding level, and where the first coding level is associated with a first set of bits and the second coding level is associated with a second set of bits. In some aspects, the decoding component 198 may be further configured to generate a first estimate of a first log-likelihood ratio (LLR) associated with the first coding level, a second estimate of a second LLR associated with the second coding level, and auxiliary information including a third estimate of a third LLR based on the first set of bits and the second set of bits. In some aspects, the decoding component 198 may be further configured to decode the first set of bits based on the first estimate of the first LLR. In some aspects, the decoding component 198 may be further configured to generate a fourth estimate of the second LLR based on the decoded first set of bits, the second estimate of the second LLR, and the auxiliary information. In some aspects, the decoding component 198 may be further configured to decode the second set of bits based on the fourth estimate of the second LLR.

In certain aspects, the base station 102 may include the decoding component 198.

Although the following description may be focused on 5G NR, the concepts described herein may be applicable to other similar areas, such as LTE, LTE-A, CDMA, GSM, and other wireless technologies.

As described herein, a node (which may be referred to as a node, a network node, a network entity, or a wireless node) may include, be, or be included in (e.g., be a component of) a base station (e.g., any base station described herein), a UE (e.g., any UE described herein), a network controller, an apparatus, a device, a computing system, an integrated access and backhauling (IAB) node, a distributed unit (DU), a central unit (CU), a remote/radio unit (RU) (which may also be referred to as a remote radio unit (RRU)), and/or another processing entity configured to perform any of the techniques described herein. For example, a network node may be a UE. As another example, a network node may be a base station or network entity. As another example, a first network node may be configured to communicate with a second network node or a third network node. In one aspect of this example, the first network node may be a UE, the second network node may be a base station, and the third network node may be a UE. In another aspect of this example, the first network node may be a UE, the second network node may be a base station, and the third network node may be a base station. In yet other aspects of this example, the first, second, and third network nodes may be different relative to these examples. Similarly, reference to a UE, base station, apparatus, device, computing system, or the like may include disclosure of the UE, base station, apparatus, device, computing system, or the like being a network node. For example, disclosure that a UE is configured to receive information from a base station also discloses that a first network node is configured to receive information from a second network node. Consistent with this disclosure, once a specific example is broadened in accordance with this disclosure (e.g., a UE is configured to receive information from a base station also discloses that a first network node is configured to receive information from a second network node), the broader example of the narrower example may be interpreted in the reverse, but in a broad open-ended way. In the example above where a UE is configured to receive information from a base station also discloses that a first network node is configured to receive information from a second network node, the first network node may refer to a first UE, a first base station, a first apparatus, a first device, a first computing system, a first set of one or more one or more components, a first processing entity, or the like configured to receive the information; and the second network node may refer to a second UE, a second base station, a second apparatus, a second device, a second computing system, a second set of one or more components, a second processing entity, or the like.

As described herein, communication of information (e.g., any information, signal, or the like) may be described in various aspects using different terminology. Disclosure of one communication term includes disclosure of other communication terms. For example, a first network node may be described as being configured to transmit information to a second network node. In this example and consistent with this disclosure, disclosure that the first network node is configured to transmit information to the second network node includes disclosure that the first network node is configured to provide, send, output, communicate, or transmit information to the second network node. Similarly, in this example and consistent with this disclosure, disclosure that the first network node is configured to transmit information to the second network node includes disclosure that the second network node is configured to receive, obtain, or decode the information that is provided, sent, output, communicated, or transmitted by the first network node.

Figure 2:
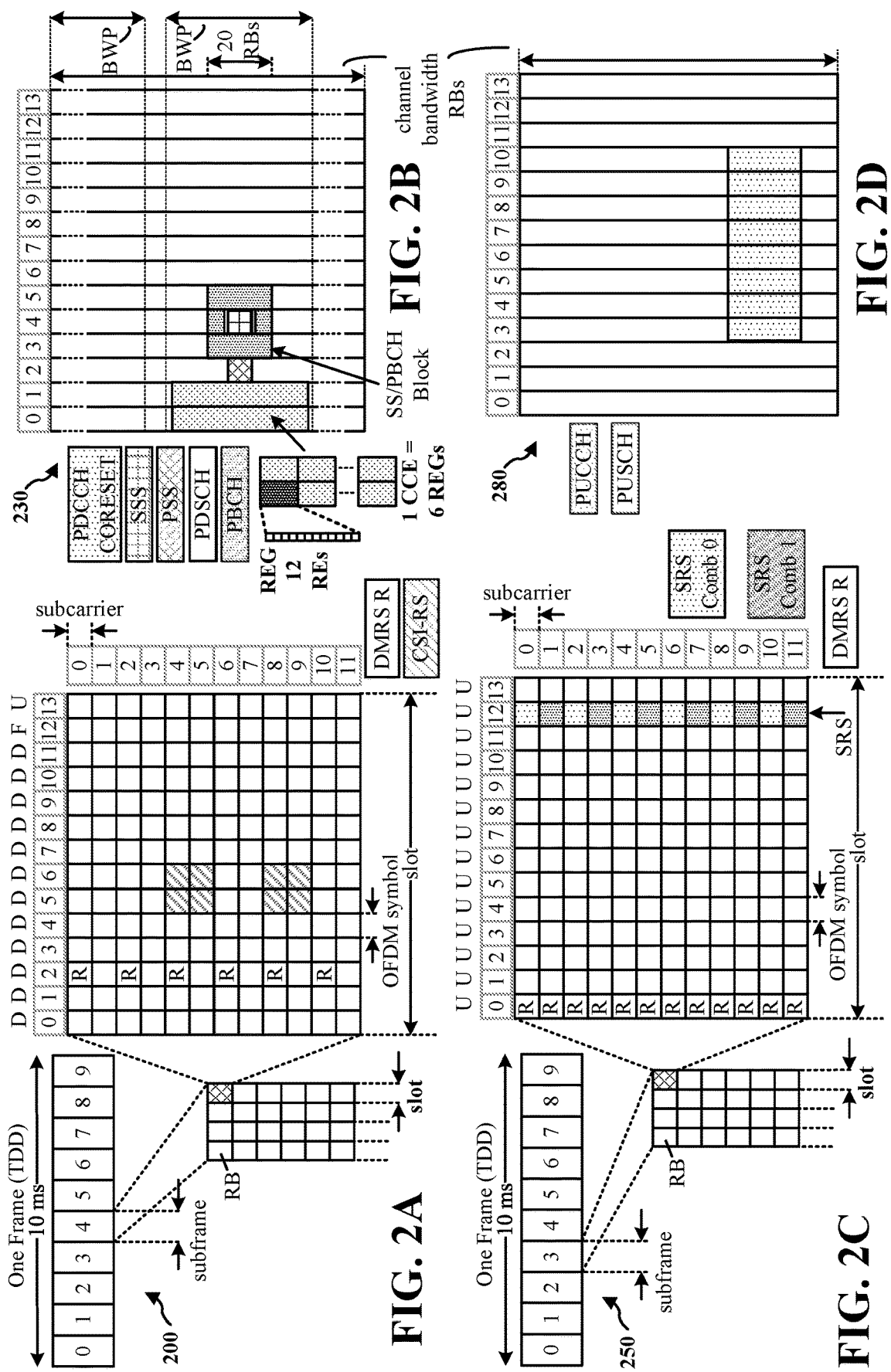
FIG. 2A is a diagram illustrating an example of a first frame, in accordance with various aspects of the present disclosure.
FIG. 2B is a diagram illustrating an example of downlink (DL) channels within a subframe, in accordance with various aspects of the present disclosure.
FIG. 2C is a diagram illustrating an example of a second frame, in accordance with various aspects of the present disclosure.
FIG. 2D is a diagram illustrating an example of uplink (UL) channels within a subframe, in accordance with various aspects of the present disclosure.

FIG. 2A is a diagram 200 illustrating an example of a first subframe within a 5G NR frame structure. FIG. 2B is a diagram 230 illustrating an example of DL channels within a 5G NR subframe. FIG. 2C is a diagram 250 illustrating an example of a second subframe within a 5G NR frame structure. FIG. 2D is a diagram 280 illustrating an example of UL channels within a 5G NR subframe. The 5G NR frame structure may be frequency division duplexed (FDD) in which for a particular set of subcarriers (carrier system bandwidth), subframes within the set of subcarriers are dedicated for either DL or UL, or may be time division duplexed (TDD) in which for a particular set of subcarriers (carrier system bandwidth), subframes within the set of subcarriers are dedicated for both DL and UL. In the examples provided by FIGS. 2A, 2C, the 5G NR frame structure is assumed to be TDD, with subframe 4 being configured with slot format 28 (with mostly DL), where D is DL, U is UL, and F is flexible for use between DL/UL, and subframe 3 being configured with slot format 1 (with all UL). While subframes 3, 4 are shown with slot formats 1, 28, respectively, any particular subframe may be configured with any of the various available slot formats 0-61. Slot formats 0, 1 are all DL, UL, respectively. Other slot formats 2-61 include a mix of DL, UL, and flexible symbols. UEs are configured with the slot format (dynamically through DL control information (DCI), or semi-statically/statically through radio resource control (RRC) signaling) through a received slot format indicator (SFI).

FIGS. 2A-2D illustrate a frame structure, and the aspects of the present disclosure may be applicable to other wireless communication technologies, which may have a different frame structure and/or different channels. A frame (10 ms) may be divided into 10 equally sized subframes (1 ms). Each subframe may include one or more time slots. Subframes may also include mini-slots, which may include 7, 4, or 2 symbols. Each slot may include 14 or 12 symbols, depending on whether the cyclic prefix (CP) is normal or extended. For normal CP, each slot may include 14 symbols, and for extended CP, each slot may include 12 symbols. The symbols on DL may be CP orthogonal frequency division multiplexing (OFDM) (CP-OFDM) symbols. The symbols on UL may be CP-OFDM symbols (for high throughput scenarios) or discrete Fourier transform (DFT) spread OFDM (DFT-s-OFDM) symbols (also referred to as single carrier frequency-division multiple access (SC-FDMA) symbols) (for power limited scenarios; limited to a single stream transmission). The number of slots within a subframe is based on the CP and the numerology. The numerology defines the subcarrier spacing (SCS) and, effectively, the symbol length/duration, which is equal to 1/SCS.

TABLE 1

Numerology, SCS, and CP

| $\mu$ | SCS $\Delta f = 2^\mu \cdot 15 [kHz]$ | Cyclic prefix |
|---|---|---|
| 0 | 15 | Normal |
| 1 | 30 | Normal |
| 2 | 60 | Normal, Extended |
| 3 | 120 | Normal |
| 4 | 240 | Normal |

For normal CP (14 symbols/slot), different numerologies $\mu$0 to 4 allow for 1, 2, 4, 8, and 16 slots, respectively, per subframe. For extended CP, the numerology 2 allows for 4 slots per subframe. Accordingly, for normal CP and numerology $\mu$, there are 14 symbols/slot and $2^\mu$ slots/subframe. The subcarrier spacing may be equal to $2^\mu*15$ kHz, where $\mu$ is the numerology 0 to 4. As such, the numerology $\mu$=0 has a subcarrier spacing of 15 kHz and the numerology $\mu$=4 has a subcarrier spacing of 240 kHz. The symbol length/duration is inversely related to the subcarrier spacing. FIGS. 2A-2D provide an example of normal CP with 14 symbols per slot and numerology $\mu$=2 with 4 slots per subframe. The slot duration is 0.25 ms, the subcarrier spacing is 60 kHz, and the symbol duration is approximately 16.67 µs. Within a set of frames, there may be one or more different bandwidth parts (BWPs) (see FIG. 2B) that are frequency division multiplexed. Each BWP may have a particular numerology and CP (normal or extended).

A resource grid may be used to represent the frame structure. Each time slot includes a resource block (RB) (also referred to as physical RBs (PRBs)) that extends 12 consecutive subcarriers. The resource grid is divided into multiple resource elements (REs). The number of bits carried by each RE depends on the modulation scheme.

As illustrated in FIG. 2A, some of the REs carry reference (pilot) signals (RS) for the UE. The RS may include demodulation RS (DM-RS) (indicated as R for one particular configuration, but other DM-RS configurations are possible) and channel state information reference signals (CSI-RS) for channel estimation at the UE. The RS may also include beam measurement RS (BRS), beam refinement RS (BRRS), and phase tracking RS (PT-RS).

FIG. 2B illustrates an example of various DL channels within a subframe of a frame. The physical downlink control channel (PDCCH) carries DCI within one or more control channel elements (CCEs) (e.g., 1, 2, 4, 8, or 16 CCEs), each CCE including six RE groups (REGs), each REG including 12 consecutive REs in an OFDM symbol of an RB. A PDCCH within one BWP may be referred to as a control resource set (CORESET). A UE is configured to monitor PDCCH candidates in a PDCCH search space (e.g., common search space, UE-specific search space) during PDCCH monitoring occasions on the CORESET, where the PDCCH candidates have different DCI formats and different aggregation levels. Additional BWPs may be located at greater and/or lower frequencies across the channel bandwidth. A primary synchronization signal (PSS) may be within symbol 2 of particular subframes of a frame. The PSS is used by a UE 104 to determine subframe/symbol timing and a physical layer identity. A secondary synchronization signal (SSS) may be within symbol 4 of particular subframes of a frame. The SSS is used by a UE to determine a physical layer cell identity group number and radio frame timing. Based on the physical layer identity and the physical layer cell identity group number, the UE can determine a physical cell identifier (PCI). Based on the PCI, the UE can determine the locations of the DM-RS. The physical broadcast channel (PBCH), which carries a master information block (MIB), may be logically grouped with the PSS and SSS to form a synchronization signal (SS)/PBCH block (also referred to as SS block (SSB)). The MIB provides a number of RBs in the system bandwidth and a system frame number (SFN). The physical downlink shared channel (PDSCH) carries user data, broadcast system information not transmitted through the PBCH such as system information blocks (SIBs), and paging messages.

As illustrated in FIG. 2C, some of the REs carry DM-RS (indicated as R for one particular configuration, but other DM-RS configurations are possible) for channel estimation at the base station. The UE may transmit DM-RS for the physical uplink control channel (PUCCH) and DM-RS for the physical uplink shared channel (PUSCH). The PUSCH DM-RS may be transmitted in the first one or two symbols of the PUSCH. The PUCCH DM-RS may be transmitted in different configurations depending on whether short or long PUCCHs are transmitted and depending on the particular PUCCH format used. The UE may transmit sounding reference signals (SRS). The SRS may be transmitted in the last symbol of a subframe. The SRS may have a comb structure, and a UE may transmit SRS on one of the combs. The SRS may be used by a base station for channel quality estimation to enable frequency-dependent scheduling on the UL.

FIG. 2D illustrates an example of various UL channels within a subframe of a frame. The PUCCH may be located as indicated in one configuration. The PUCCH carries uplink control information (UCI), such as scheduling requests, a channel quality indicator (CQI), a precoding matrix indicator (PMI), a rank indicator (RI), and hybrid automatic repeat request (HARQ) acknowledgment (ACK) (HARQ-ACK) feedback (i.e., one or more HARQ ACK bits indicating one or more ACK and/or negative ACK (NACK)). The PUSCH carries data, and may additionally be used to carry a buffer status report (BSR), a power headroom report (PHR), and/or UCI.

Figure 3:
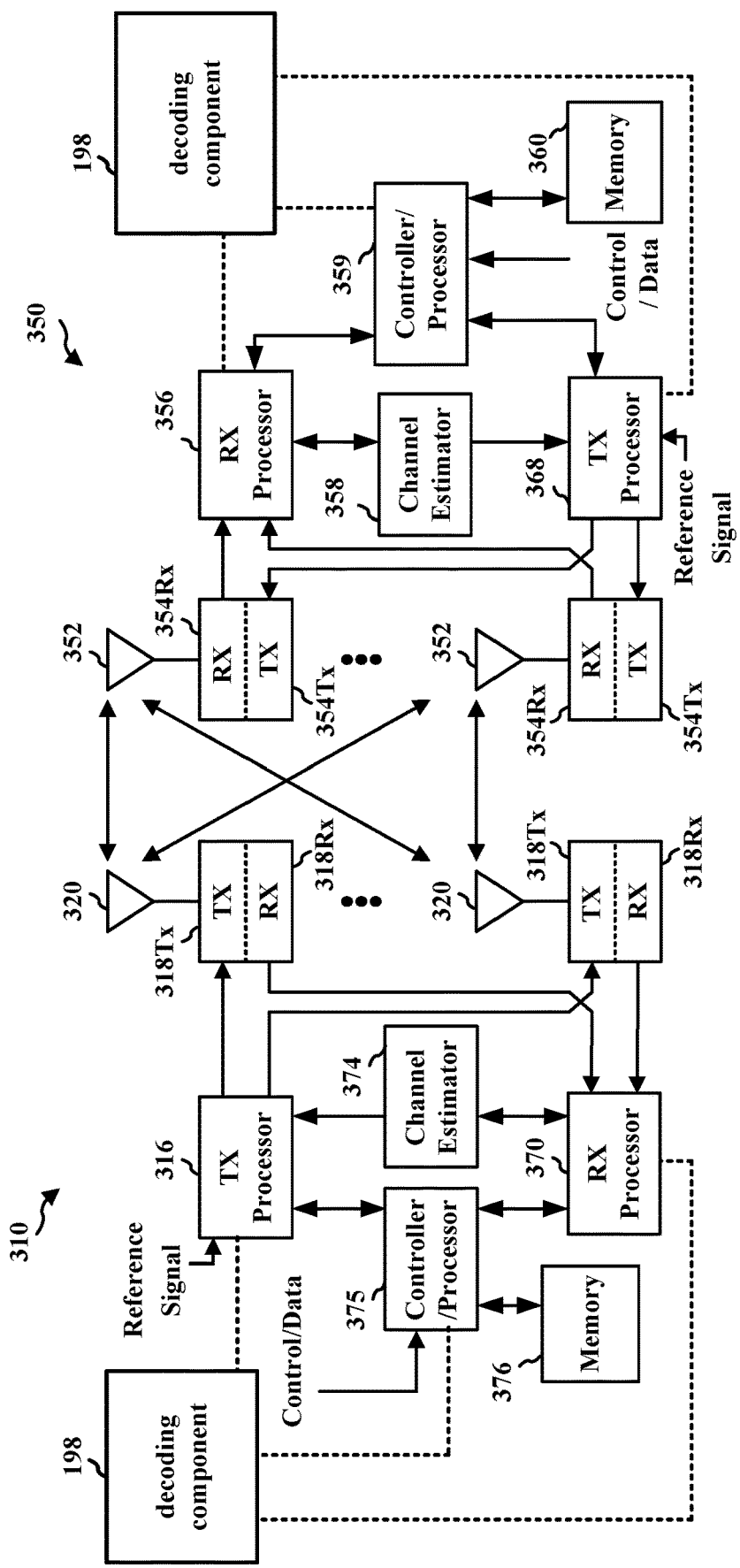
FIG. 3 is a diagram illustrating an example of a base station and user equipment (UE) in an access network.

FIG. 3 is a block diagram of a base station 310 in communication with a UE 350 in an access network. In the DL, Internet protocol (IP) packets may be provided to a controller/processor 375. The controller/processor 375 implements layer 3 and layer 2 functionality. Layer 3 includes a radio resource control (RRC) layer, and layer 2 includes a service data adaptation protocol (SDAP) layer, a packet data convergence protocol (PDCP) layer, a radio link control (RLC) layer, and a medium access control (MAC) layer. The controller/processor 375 provides RRC layer functionality associated with broadcasting of system information (e.g., MIB, SIBs), RRC connection control (e.g., RRC connection paging, RRC connection establishment, RRC connection modification, and RRC connection release), inter radio access technology (RAT) mobility, and measurement configuration for UE measurement reporting; PDCP layer functionality associated with header compression/decompression, security (ciphering, deciphering, integrity protection, integrity verification), and handover support functions; RLC layer functionality associated with the transfer of upper layer packet data units (PDUs), error correction through ARQ, concatenation, segmentation, and reassembly of RLC service data units (SDUs), re-segmentation of RLC data PDUs, and reordering of RLC data PDUs; and MAC layer functionality associated with mapping between logical channels and transport channels, multiplexing of MAC SDUs onto transport blocks (TBs), demultiplexing of MAC SDUs from TBs, scheduling information reporting, error correction through HARQ, priority handling, and logical channel prioritization.

The transmit (TX) processor 316 and the receive (RX) processor 370 implement layer 1 functionality associated with various signal processing functions. Layer 1, which includes a physical (PHY) layer, may include error detection on the transport channels, forward error correction (FEC) coding/decoding of the transport channels, interleaving, rate matching, mapping onto physical channels, modulation/demodulation of physical channels, and MIMO antenna processing. The TX processor 316 handles mapping to signal constellations based on various modulation schemes (e.g., binary phase-shift keying (BPSK), quadrature phase-shift keying (QPSK), M-phase-shift keying (M-PSK), M-quadrature amplitude modulation (M-QAM)). The coded and modulated symbols may then be split into parallel streams. Each stream may then be mapped to an OFDM subcarrier, multiplexed with a reference signal (e.g., pilot) in the time and/or frequency domain, and then combined together using an Inverse Fast Fourier Transform (IFFT) to produce a physical channel carrying a time domain OFDM symbol stream. The OFDM stream is spatially precoded to produce multiple spatial streams. Channel estimates from a channel estimator 374 may be used to determine the coding and modulation scheme, as well as for spatial processing. The channel estimate may be derived from a reference signal and/or channel condition feedback transmitted by the UE 350. Each spatial stream may then be provided to a different antenna 320 via a separate transmitter 318Tx. Each transmitter 318Tx may modulate a radio frequency (RF) carrier with a respective spatial stream for transmission.

At the UE 350, each receiver 354Rx receives a signal through its respective antenna 352. Each receiver 354Rx recovers information modulated onto an RF carrier and provides the information to the receive (RX) processor 356. The TX processor 368 and the RX processor 356 implement layer 1 functionality associated with various signal processing functions. The RX processor 356 may perform spatial processing on the information to recover any spatial streams destined for the UE 350. If multiple spatial streams are destined for the UE 350, they may be combined by the RX processor 356 into a single OFDM symbol stream. The RX processor 356 then converts the OFDM symbol stream from the time-domain to the frequency domain using a Fast Fourier Transform (FFT). The frequency domain signal comprises a separate OFDM symbol stream for each subcarrier of the OFDM signal. The symbols on each subcarrier, and the reference signal, are recovered and demodulated by determining the most likely signal constellation points transmitted by the base station 310. These soft decisions may be based on channel estimates computed by the channel estimator 358. The soft decisions are then decoded and deinterleaved to recover the data and control signals that were originally transmitted by the base station 310 on the physical channel. The data and control signals are then provided to the controller/processor 359, which implements layer 3 and layer 2 functionality.

The controller/processor 359 can be associated with a memory 360 that stores program codes and data. The memory 360 may be referred to as a computer-readable medium. In the UL, the controller/processor 359 provides demultiplexing between transport and logical channels, packet reassembly, deciphering, header decompression, and control signal processing to recover IP packets. The controller/processor 359 is also responsible for error detection using an ACK and/or NACK protocol to support HARQ operations.

Similar to the functionality described in connection with the DL transmission by the base station 310, the controller/processor 359 provides RRC layer functionality associated with system information (e.g., MIB, SIBs) acquisition, RRC connections, and measurement reporting; PDCP layer functionality associated with header compression/decompression, and security (ciphering, deciphering, integrity protection, integrity verification); RLC layer functionality associated with the transfer of upper layer PDUs, error correction through ARQ, concatenation, segmentation, and reassembly of RLC SDUs, re-segmentation of RLC data PDUs, and reordering of RLC data PDUs; and MAC layer functionality associated with mapping between logical channels and transport channels, multiplexing of MAC SDUs onto TBs, demultiplexing of MAC SDUs from TBs, scheduling information reporting, error correction through HARQ, priority handling, and logical channel prioritization.

Channel estimates derived by a channel estimator 358 from a reference signal or feedback transmitted by the base station 310 may be used by the TX processor 368 to select the appropriate coding and modulation schemes, and to facilitate spatial processing. The spatial streams generated by the TX processor 368 may be provided to different antenna 352 via separate transmitters 354Tx. Each transmitter 354Tx may modulate an RF carrier with a respective spatial stream for transmission.

The UL transmission is processed at the base station 310 in a manner similar to that described in connection with the receiver function at the UE 350. Each receiver 318Rx receives a signal through its respective antenna 320. Each receiver 318Rx recovers information modulated onto an RF carrier and provides the information to a RX processor 370.

The controller/processor 375 can be associated with a memory 376 that stores program codes and data. The memory 376 may be referred to as a computer-readable medium. In the UL, the controller/processor 375 provides demultiplexing between transport and logical channels, packet reassembly, deciphering, header decompression, control signal processing to recover IP packets. The controller/processor 375 is also responsible for error detection using an ACK and/or NACK protocol to support HARQ operations.

At least one of the TX processor 368, the RX processor 356, and the controller/processor 359 may be configured to perform aspects in connection with decoding component 198 of FIG. 1.

At least one of the TX processor 316, the RX processor 370, and the controller/processor 375 may be configured to perform aspects in connection with decoding component 198 of FIG. 1.

For higher order modulation, to achieve a larger spectral efficiency (e.g., compared to binary phase shift keying (BPSK), a bit tuple may be mapped onto one constellation/modulation symbol. Phase shift keying (PSK) may refer to a modulation process which conveys data by modulating the phase of a constant frequency reference signal (e.g., a carrier wave). BPSK may also be referred to as 2PSK and may use two phases which are separated by 180° for modulating the signal. Quadrature amplitude modulation (QAM) may utilize both amplitude and phase components to provide a form of modulation. Based on QAM, a signal in which two carriers shifted in phase by 90 degrees (i.e., sine and cosine) may be modulated and combined. The resultant overall signal may include a combination of both in-phase (I) (e.g., cosine waveform) and quadrature (Q) (e.g., sine waveform) carriers and may include both amplitude and phase variations.

Figure 4:
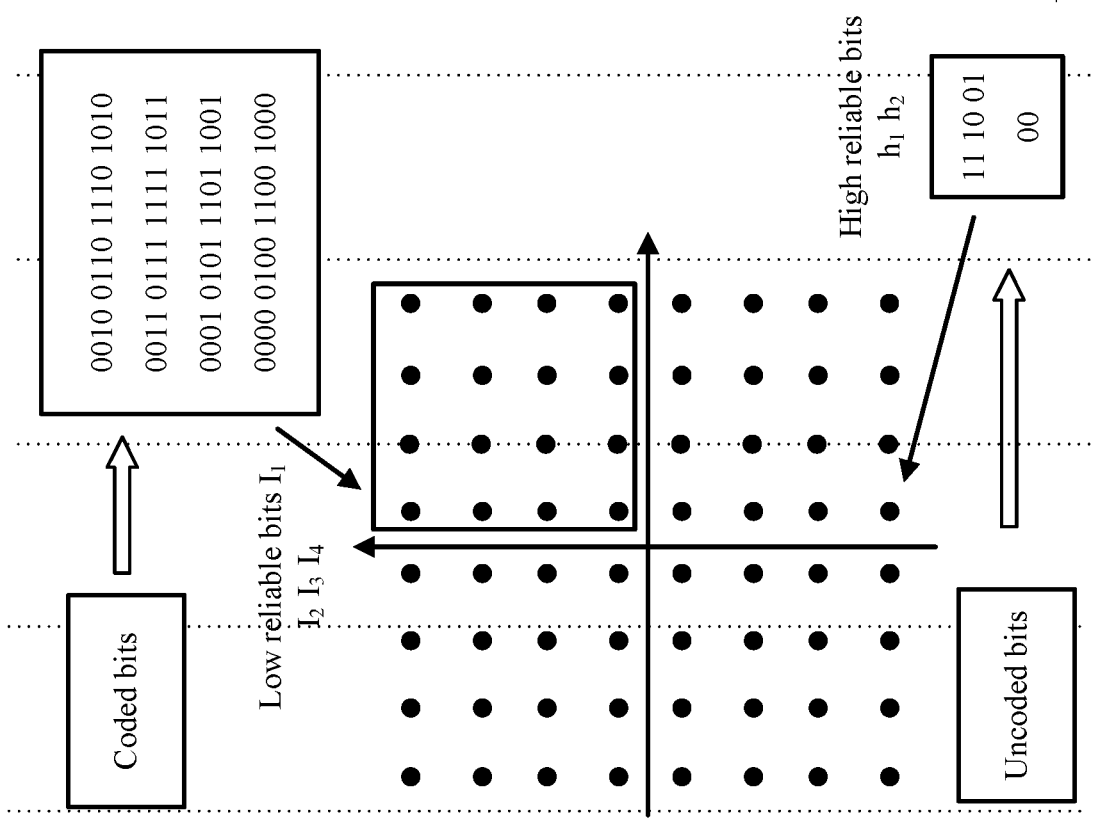
FIG. 4 is a diagram illustrating multi-level coding and multi-stage coding.

Depending on how each bit in the bit tuple are mapped to a constellation point, the reliability of the bits may be different. FIG. 4 is a diagram 400 illustrating multi-level coding and multi-stage coding. As illustrated in FIG. 4, in 64 QAM (e.g., 6 bits map to 1 constellation point), conditioned on the last 4 bits, the first 2 bits form a quadrature phase shift keying (QPSK) constellation, and may be decoded with very high reliability (if the receiving (Rx) side knows what the last 4 bits are). QPSK may also be referred to as 4-PSK which may use four points on a constellation diagram (i.e., a representation of a signal modulated by a digital modulation scheme such as QAM or PSK).

Figure 5:
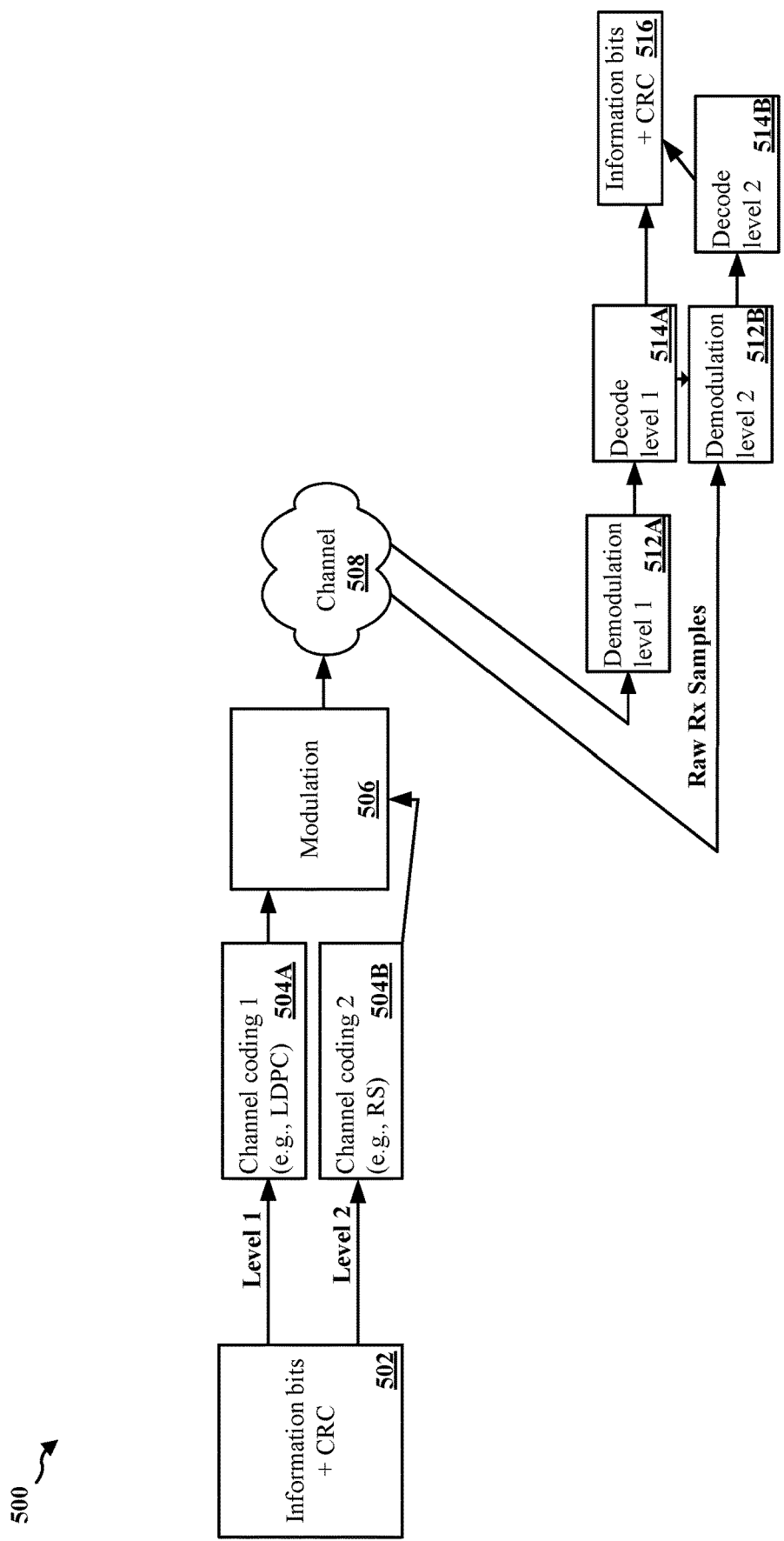
FIG. 5 is a diagram illustrating encoding and decoding based on multi-level coding and multi-stage coding.

MLC or multi-stage coding (MSC) may use separate channel codes on the bits that are mapped to different levels of the constellation points. For example, in the 64QAM example, the last 4 bits (least significant bits (LSBs)) can be jointly encoded with one codeword, and the first two bits (most significant bits (MSBs)) may be encoded with a second codeword, or may be uncoded. An advantage of MLC is that a simple code (or uncode) may be applied on the MSBs, resulting in less encoding/decoding complexity and less computing resource utilization on both the encoder and the decoder. However, at the receiver end, a multi-staging decoding may be employed to decode communications transmitted based on MSC. FIG. 5 is a diagram 500 illustrating encoding and decoding based on multi-level coding and multi-stage coding. As illustrated in FIG. 5, one or more information bits plus cyclic redundancy check (CRC) bits 502 may be encoded at level 1 based on a first channel coding 504A (e.g., low-density parity check (LDPC). The one or more information bits plus CRC bits 502 may also be encoded at level 2 based on a second channel coding 504B (e.g., Reed-Solomon (RS)).

LDPC may be a linear error correcting method. A LDPC code may be specified by a parity-check matrix containing mostly 0s and a low density of 1s. The rows of the matrix may represent the equations and the columns represent the bits in the codeword, i.e., code symbols. A LDPC code may be represented by, where the block length may be the number of 1s in each column and may be the number of 1s in each row, holding the following properties: j is the small fixed number of 1's in each column, where j>3, k is the small fixed number of 1's in each row, where k>j. A RS code may be a family of codes where every code is characterized by three parameters: an alphabet size q, a block length n, and a message length k, with k<n≤q. The set of alphabet symbols may be interpreted as a finite field of order q, and thus, q is a prime power.

Figure 12:
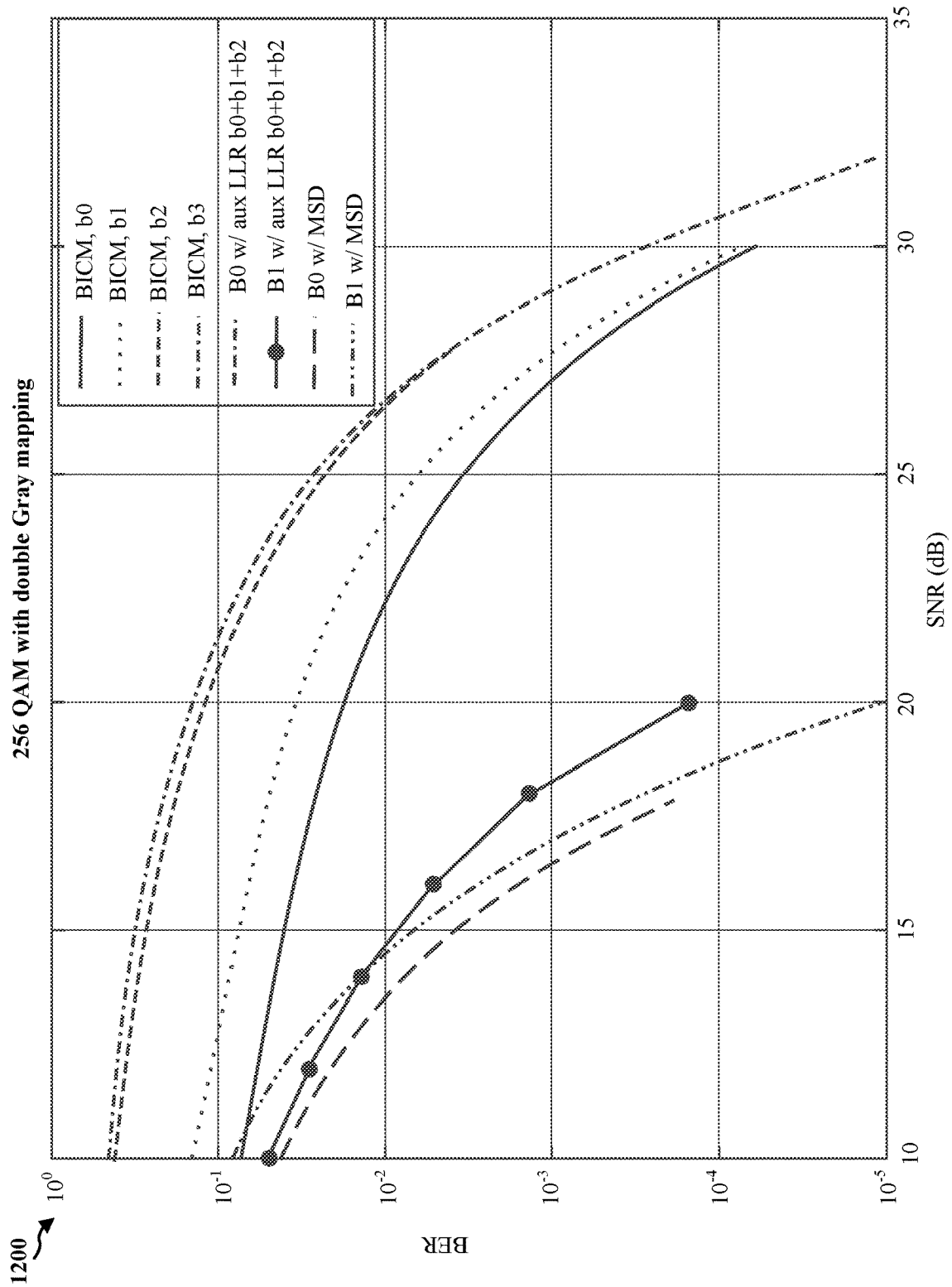
FIG. 12 is a diagram illustrating performance of different decoding.

A result of the first channel coding 504A and a result of the second channel coding 504B may be modulated at modulation 506. After modulation 506, the modulated signal may be transmitted via a channel 508 to a receiver. At the receiver, the receiver may perform a first level demodulation 512A and then a first level decode 514A. For example, the receiver may first demodulate the LSBs and decode the LSBs. A result of the first level decode 514A may be used for a second level demodulation 512B. For example, the decoded LSBs may be feed into the demodulator for re-performing the demodulation of the MSBs. Performance at the receiver may suffer if all of the bits are demodulated at once without further post-processing instead of separate at first level demodulation 512A and second level demodulation 512B. A result of the second level demodulation 512B may be decoded at second level decode 514B. The information bits and CRC bits 516 may be accordingly decoded. However, such type of multi-stage decoding, for some demodulators (e.g., a nonlinear MIMO demodulator), the complexity and computing resource cost of the demodulation may be high. Aspects provided herein provide mechanisms for multi-level/multi-stage demodulation and decoding with a lower complexity and computing resource cost. FIG. 12 is a diagram 1200 illustrating example performance based on aspects provided herein using auxiliary (aux) information compared with multi-stage decoding or bit-interleaved coded modulation (BICM). As illustrated in FIG. 12, the curve B0 with (w/) auxiliary information (aux) LLR b0+b1+b2 coincides with B1 w. aux LLR b0+b1+b2. As illustrated in FIG. 12, with the auxiliary information LLR based on b0+b1+b2, bit error rate performance of B1 and B2 may be the same.

Figure 6:
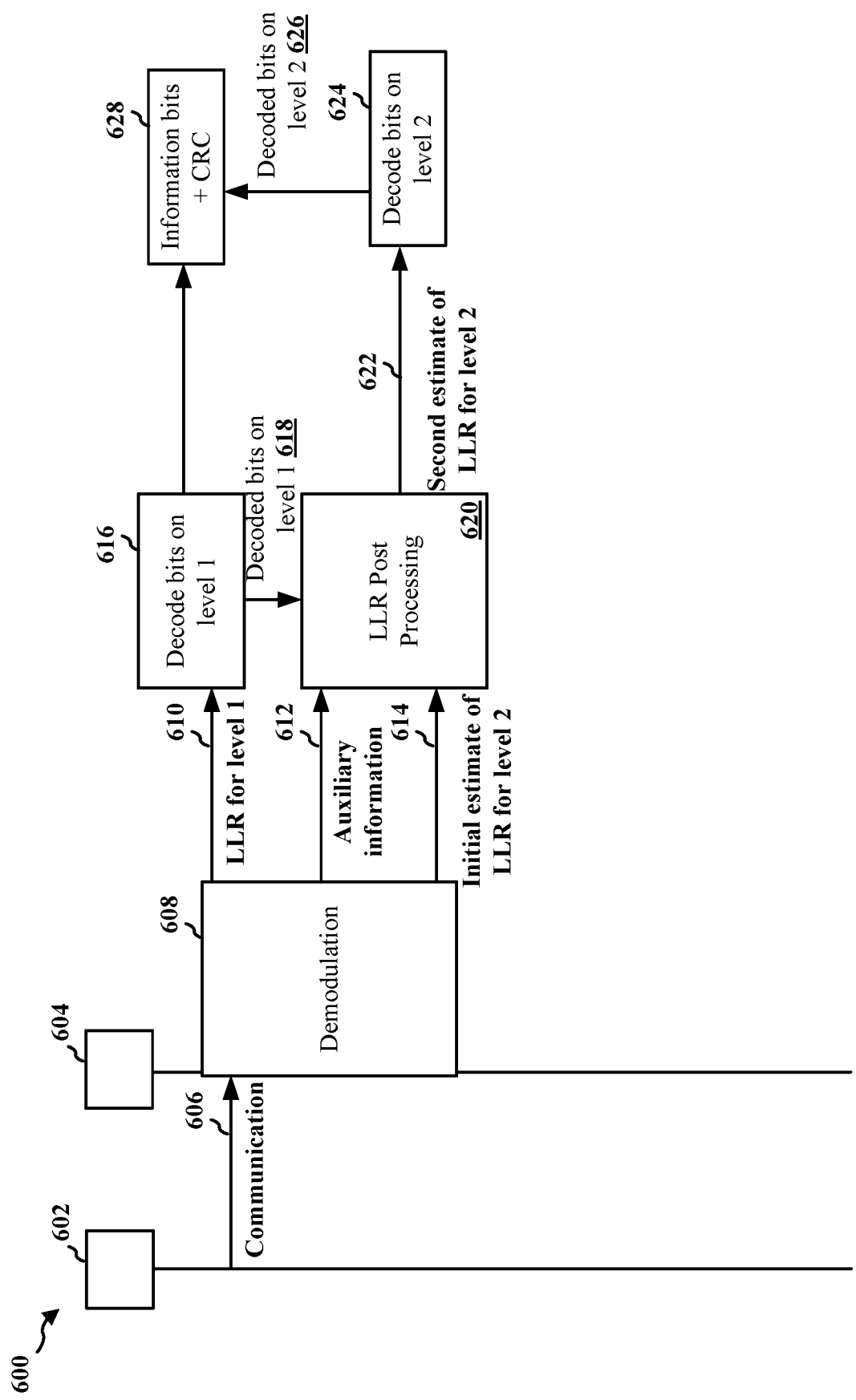
FIG. 6 is a diagram illustrating example communications between two network entities.

FIG. 6 is a diagram 600 illustrating example communications between two network entities, a network entity 602 and a network entity 604. The network entity 602 and the network entity 604 may be any one of a UE, a base station, or any other type of entity that may transmit and receive in a network. As illustrated in FIG. 6, the network entity 602 may transmit a communication 606 to the network entity 604 over a channel. Upon receiving the communication 606, the network entity 604 may perform demodulation at 608. During the demodulation at 608, the network entity 604 may generate an estimate of LLR for the bits transmitted on level 1 610 (e.g., based on all of a subset of bits for level 1), an initial estimate of LLR for level 2 614 (e.g., based on all of a subset of bits for level 2), and auxiliary information 612. In some aspects, the auxiliary information 612 may be used for improving the quality of the estimate of LLR for level 2 based on the values for bits on level 1 obtained from the decoding result for level 1 (e.g., 616) through a post processing unit (e.g., LLR post-processing 620). In some aspects, the estimate of LLR for the bits transmitted on level 1 610 may be used by the network entity 604 to decode the bits on level 1 at 616. In some aspects, the decoded level 1 bits 618, the auxiliary information 612, and the initial estimate of LLR for level 2 614 may be used by the network entity 604 to generate a second estimate of LLR for the bits on level 2 622 by performing LLR post-processing at 620. Upon generating the second estimate of LLR for the bits on level 2 622, the network entity 604 may decode the bits on level 2 at 624. After generating the decoded level 2 bits 626, together with the decoded level 1 bits 618, the network entity 604 may recover the information bits and CRC bits 628 carried by the communication 606. In some aspects, the auxiliary information 612 may also be referred to as auxiliary LLR values. In some aspects, the auxiliary information 612 may include a LLR estimate based on an XOR of one or more bits (e.g., a subset or all bits) in the first level and one or more bits (e.g., a subset or all bits) in the second level.

Compared with the architecture in FIG. 5, there is no second demodulation and there is a LLR post-processing, which may be much less complex than a second demodulation. Therefore, the complexity and computing resource cost of the demodulation may be much lower while the performance is still decent by utilizing post-processing based on the auxiliary information 612.

FIG. 7A is a diagram 700 illustrating example bits with 4-pulse amplitude modulation (4PAM) (which may be the I/Q component of 16QAM), where two bits [$b_0$,$b_1$] are mapped to a real constellation {−3,−1,1,3} modulo power normalization. As illustrated in FIG. 7A, $b_0$ may be the bit on the left and $b_1$ may be the next bit. The network entity 604 may perform demodulation at 608 and generate the LLR of $b_0$ and $b_1$ (which may be LLR for level 2 614 and LLR for the bits transmitted on level 1 610) via either Log-MAP (e.g., standard log-map) or Max-Log-Map (e.g., maximum-log-map) algorithm. The demodulation at 608 may also generate, in addition to the LLRs of $b_0$ and $b_1$, the LLR of $b_0$ XOR (which may also be denoted by ⊕) $b_1$ as auxiliary information 612 (e.g., $LLR_{initial}(b_0 \oplus b_1)$). In some aspects, at the LLR post-processing 620, after the bits on level 1 616 (e.g., $b_1$) are decoded (denoted the decoded bits by $\hat{b}_1$), a second estimate of LLR of $b_0$ (e.g., second estimate of LLR for the bits on level 2 622) may be generated based on:

$LLR_{post}(b_0)=LLR_{initial}(b_0)+(-1)^{\hat{b}_1} LLR_{initial}(b_0 \oplus b_1)$, where $LLR_{initial}$ may denote initial LLR estimate and $LLR_{post}$ may denote LLR estimate after decoding the bits on level 1. The initial estimate of the LLR for level 2, the decoded bits for level 1, and the auxiliary information 612 are used together to generate a more accurate second estimate of LLR for the bits on level 2 622 after the decoded bits for level 1 are known to the network entity 604.

To generate the auxiliary information 612, such as LLRs for $b_0$ XOR $b_1$, consider a 16QAM (which may also be 4-pulse amplitude modulation (4PAM)) example illustrated in FIG. 7A, given the bit to constellation mapping rule, the network entity 604 may compute the $b_0$ XOR $b_1$ value for each constellation points, and use the standard log-map or maximum-log-map to compute the LLR for $b_0$ XOR $b_1$. For example, with maximum-log-map, the network entity 604 may generate:

$$LLR(b_0 \text{ XOR } b_1) = const \cdot \left\{ \min_{x \in C_0} |y-x|^2 - \min_{x \in C_1} |y-x|^2 \right\},$$

where $C_0$ and $C_1$ denote the subset of constellation points with $b_0$ XOR $b_1$=0 and 1, respectively, and y denotes the received signal (e.g., after proper equalization). As illustrated in FIG. 7A, C0 denotes the constellations corresponding to 11 and 00, and C1 denotes the constellations corresponding to 10 and 01.

FIG. 7B is a diagram 730 illustrating example bits with 64QAM/8PAM. In some aspects, the first level may include the 2 LSB bits ($b_1$,$b_2$), and the second level may include the MSB bit $b_0$. As illustrated in FIG. 7B, $b_0$ may be the bit on the left, $b_1$ may be the middle bit, and $b_2$ may be the bit on the right. In other words, the bits may be labeled as $b_0$, $b_1$, $b_2$, $b_{m-1}$ where m may be the modulation order (e.g., log 2 of the number of constellations). The network entity 604 may generate the auxiliary information 612 as one or more of: $LLR(b_0 \oplus b_1)$ or $LLR(b_0 \oplus b_2)$ or $LLR(b_0 \oplus b_1 \oplus b_2)$. As an example, the auxiliary information 612 may be generated as $LLR(b_0 \oplus b_1)$. For the MSB, the minimum distance between the constellations with $b_0=0$ and the constellations with $b_0=1$ is 2, which may be achieved with the constellation 732 (e.g., corresponds to bits 111) and constellation 734 (e.g., corresponds to bits 001). In some aspects, for the auxiliary information, the bits may be selected such that the XOR results in a same value for a pair of constellations that may have a minimum distance between them among all modulation constellations. Therefore, $b_0$ and $b_1$ are selected. In this case, the pair of constellation 732 and the constellation 734 may determine the bit error rate of the MSB under bit-interleaved coded modulation (BICM). In BICM, a demodulator may demodulate each bit of the constellation independently without interaction with the decoder and without multi-stage decoding. In some aspects, $b_0 \oplus b_1$ may equal to zero for both of the two constellations and the network entity 604 may be able to estimate $b_0 \oplus b_1$ correctly with a high probability. Similar to the example illustrated in FIG. 7A, the network entity 604 may perform demodulation at 608 and generate the LLR of $b_0$ and $b_1$ (which may be the LLR for level 2 614 and the LLR for the bits transmitted on level 1 610) via either Log-MAP or Max-Log-Map algorithm. The demodulation at 608 may also generate, in addition to the LLRs of $b_0$ and $b_1$, the LLR of $b_0$ XOR (which may also be denoted by $\oplus$) $b_1$ as auxiliary information 612 (e.g., $LLR_{initial}(b_0 \oplus b_1)$). In some aspects, at the LLR post-processing 620, after a subset of the bits on level 1 616 (e.g., $b_1$) are decoded (denoted by $\hat{b}_1$), a second estimate of LLR of $b_0$ (e.g., second estimate of LLR for the bits on level 2 622) may be generated based on: $LLR_{post}(b_0)=LLR_{initial}(b_0)+(-1)^{\hat{b}_1} LLR_{initial}(b_0 \oplus b_1)$. The initial estimate of the LLR for level 2, the decoded subset of bits for level 1, and the auxiliary information 612 are used together to generate a more accurate second estimate of LLR for the bits on level 2 622 after the decoded subset of bits for level 1 are known to the network entity 604.

FIG. 7C is a diagram 750 illustrating example bits with 256QAM/16PAM. In the example illustrated in FIG. 7C, double-Gray mapping with 2 levels, 2 LSBs ($b_3$, $b_2$) on level 1, and 2 MSBs ($b_1$, $b_0$) on level 2 may be used. As illustrated in FIG. 7B, $b_0$ may be the bit on the left, $b_1$ may be the next bit to the right of $b_0$, $b_2$ may be the next bit to the right of $b_1$, and $b_3$ may be the rightmost bit. In other words, the bits may be labeled as $b_0$, $b_1$, $b_2$, $b_{m-1}$ where m may be the modulation order (e.g., log 2 of the number of constellations). In other words, the bits may be labeled as $b_0$, $b_1$, $b_2$, $b_{m-1}$ where m may be the modulation order (e.g., log 2 of the number of constellations). In some aspects, the network entity 604 may generate the auxiliary information 612 as $LLR(b_0 \oplus b_1 \oplus b_2)$. As illustrated in FIG. 7C, for $b_0$, the BER rate may be primarily dominated by the constellations that are close among constellations with $b_0=0$ and the constellations with $b_0=1$, which may be the constellation 752, constellation 754, constellation 756, and constellation 758. For the constellation 752, constellation 754, constellation 756, and constellation 758, $b_0 \oplus b_1 \oplus b_2$ may be 0. Similarly, for $b_1$, the BER rate may be primarily dominated by the constellations that are close among constellations with $b_1=0$ and the constellations with $b_1=1$, which may be the constellation 762, constellation 764, constellation 766, constellation 768, constellation 772, constellation 774, constellation 776, and constellation 778. For these constellations, $b_0 \oplus b_1 \oplus b_2$ may be 0. In some aspects, for the auxiliary information, the bits may be selected such that the XOR results in a same value for a set of constellations that may have a minimum distance between them among all modulation constellations. Therefore, $b_0 \oplus b_1 \oplus b_2$ are selected. In some aspects, after decoding the bits on level 1 618 (e.g., $b_2$ and $b_3$), the network entity 604 may obtain $LLR(b_0)$, $LLR(b_1)$ from initial demodulation, and obtain $LLR(b_0 \oplus b_1)$ by cancelling $b_2$ from $LLR(b_0 \oplus b_1 \oplus b_2)$. These LLRs may form a simplex code $[b_0, b_1, b_0 \oplus b_1]$ and the post-processing at 620 may decode the simplex code.

In some aspects, the network entity 604 may generate the auxiliary information 612 as both $LLR(b_0 \oplus b_2)$ and $LLR(b_1 \oplus b_2)$. After decoding $b_1$ (e.g., at decode bits on level 1 616), the network entity 604 may decode $b_0$ and $b_1$ separately with the following formula: $LLR_{post}(b_j)=LLR_{initial}(b_j)+(-1)^{\hat{b}_1} LLR_{initial}(b_j \oplus b_2)$, where j=0 or 1. In other words, different second estimate of LLR for the bits on level 2 622 may be generated for different subsets of bits at level 2 based on different initial estimates of LLR for level 2 for the different subsets of bits at level 2 614, different part of the auxiliary information 612, and the decoded bits on level 1 618.

Figure 8:
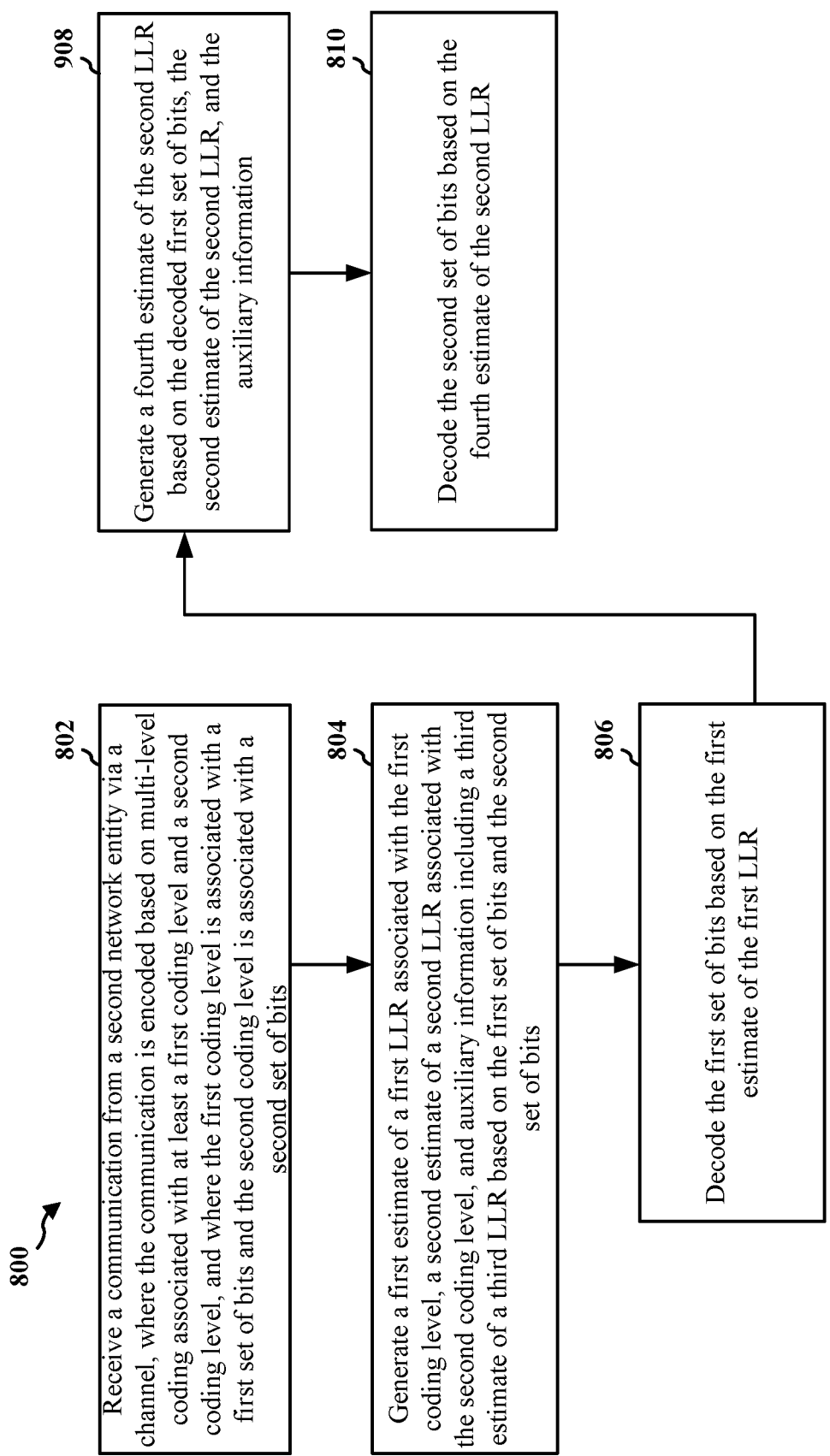
FIG. 8 is a flowchart of a method of wireless communication.

FIG. 8 is a flowchart 800 of a method of wireless communication. The method may be performed by a first network entity (e.g., the UE 104, the base station 102; the apparatus 904, the network entity 902, the network entity 1002, the network entity 1160).

At 802, the network entity may receive a communication from a second network entity via a channel, where the communication is encoded based on multi-level coding associated with at least a first coding level and a second coding level, and where the first coding level is associated with a first set of bits and the second coding level is associated with a second set of bits. For example, the network entity 604 may receive a communication 606 from a network entity 602 via a channel, where the communication is encoded based on multi-level coding associated with at least a first coding level and a second coding level, and where the first coding level is associated with a first set of bits and the second coding level is associated with a second set of bits. In some aspects, 802 may be performed by decoding component 198.

At 804, the network entity may generate a first estimate of a first LLR associated with the first coding level, a second estimate of a second LLR associated with the second coding level, and auxiliary information including a third estimate of a third LLR based on the first set of bits and the second set of bits. For example, the network entity 604 may generate a first estimate of a first LLR (e.g., 610) associated with the first coding level, a second estimate of a second LLR (e.g., 614) associated with the second coding level, and auxiliary information (e.g., 612) including a third estimate of a third LLR based on the first set of bits and the second set of bits. In some aspects, 804 may be performed by decoding component 198. In some aspects, the third estimate of the third LLR is based on an XOR of the first set of bits and the second set of bits. In some aspects, the third estimate of the third LLR is based on an XOR of a first bit in the first set of bits and a second bit in the second set of bits. In some aspects, the third estimate of the third LLR is based on an XOR of a first one or more bits in the first set of bits and a second one or more bits in the second set of bits. In some aspects, the first one or more bits correspond to the first set of bits or a first subset of the first set of bits, and where the second one or more bits correspond to the second set of bits or a second subset of the second set of bits. In some aspects, the first one or more bits of the first subset of bits and the second one or more bits of the second subset of bits are selected such that the XOR achieve a same value for at least one pair of constellations in which a bit differs. In some aspects, the pair of constellations have a minimum distance among all constellations in a set of modulation constellations associated with the communication. In some aspects, the auxiliary information may include a fifth estimate of a fifth LLR based on the first set of bits and the second set of bits, where the third estimate of the third LLR is based on a first exclusive disjunction of a first one or more bits in the first set of bits and a second one or more bits the second set of bits, and where the fifth estimate of the fifth LLR is based on a second exclusive disjunction of a third one or more bits in the first set of bits and a fourth one or more bits the second set of bits, where the first one or more bits is different from the third one or more bits or the second one or more bits is different from the fourth one or more bits. In some aspects, the auxiliary information is based on a standard log-map or a maximum-log-map based on exclusive disjunction (XOR) of a first one or more bits in the first set of bits and a second one or more bits in the second set of bits.

At 806, the network entity may decode the first set of bits based on the first estimate of the first LLR. For example, the network entity 604 may decode (e.g., 616) the first set of bits based on the first estimate of the first LLR. In some aspects, 806 may be performed by decoding component 198.

At 808, the network entity may generate a fourth estimate of the second LLR based on the decoded first set of bits, the second estimate of the second LLR, and the auxiliary information. For example, the network entity 604 may generate (e.g., 620) a fourth estimate of the second LLR (e.g., 622) based on the decoded first set of bits, the second estimate of the second LLR, and the auxiliary information. In some aspects, 808 may be performed by decoding component 198. In some aspects, the fourth estimate of the second LLR is based on a sum of (1) the second estimate of the second LLR and (2) negative one to a power of the decoded first set of bits multiplied by the third estimate of the third LLR.

At 810, the network entity may decode the second set of bits based on the fourth estimate of the second LLR. For example, the network entity 604 may decode (e.g., 624) the second set of bits based on the fourth estimate of the second LLR. In some aspects, 810 may be performed by decoding component 198.

Figure 9:
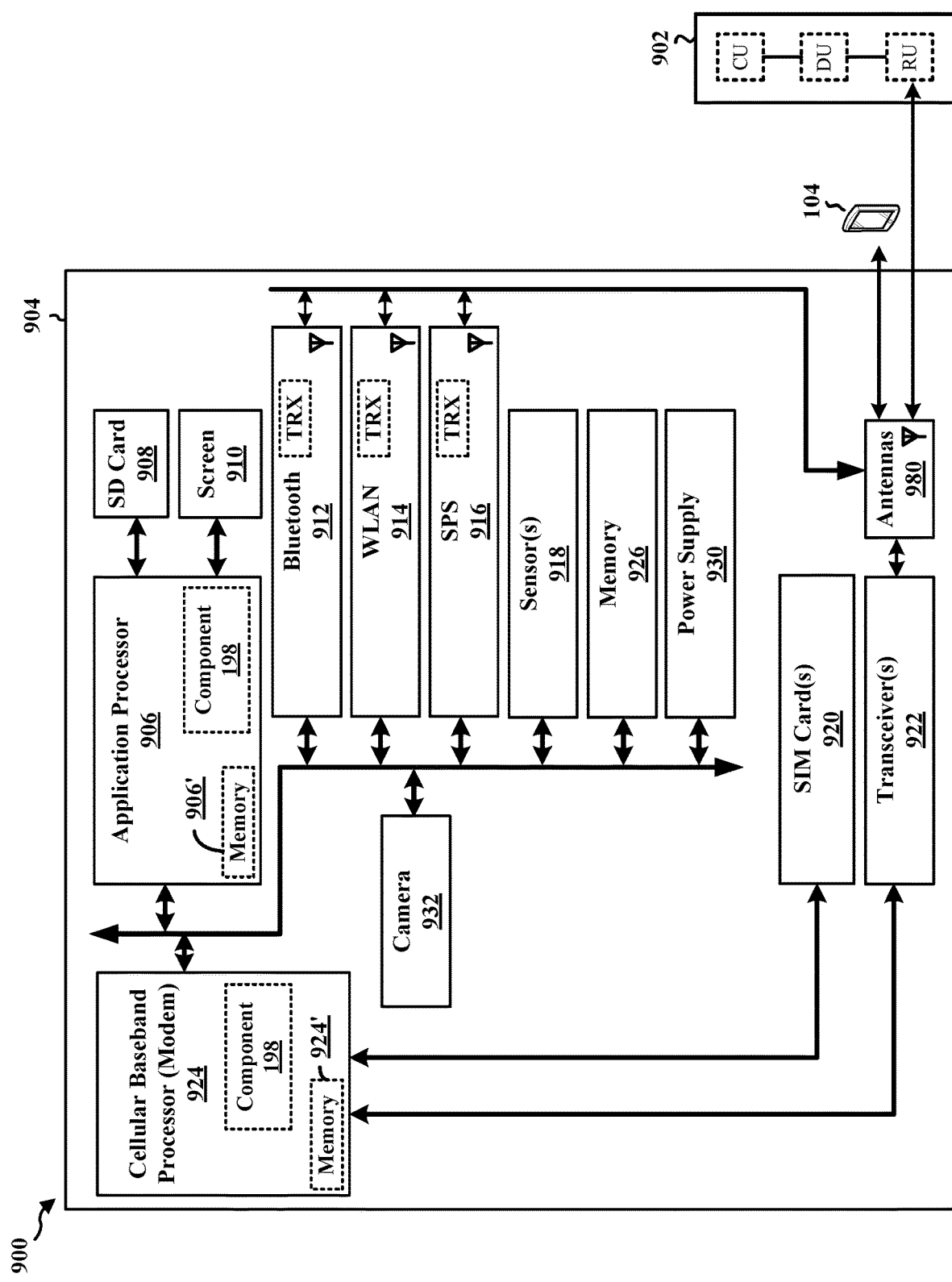
FIG. 9 is a diagram illustrating an example of a hardware implementation for an example apparatus and/or network entity.

FIG. 9 is a diagram 900 illustrating an example of a hardware implementation for an apparatus 904. The apparatus 904 may be a UE, a component of a UE, or may implement UE functionality. In some aspects, the apparatus 904 may include a cellular baseband processor 924 (also referred to as a modem) coupled to one or more transceivers 922 (e.g., cellular RF transceiver). The cellular baseband processor 924 may include on-chip memory 924'. In some aspects, the apparatus 904 may further include one or more subscriber identity modules (SIM) cards 920 and an application processor 906 coupled to a secure digital (SD) card 908 and a screen 910. The application processor 906 may include on-chip memory 906'. In some aspects, the apparatus 904 may further include a Bluetooth module 912, a WLAN module 914, a satellite system module 916 (e.g., GNSS module), one or more sensor modules 918 (e.g., barometric pressure sensor/altimeter; motion sensor such as inertial management unit (IMU), gyroscope, and/or accelerometer(s); light detection and ranging (LIDAR), radio assisted detection and ranging (RADAR), sound navigation and ranging (SONAR), magnetometer, audio and/or other technologies used for positioning), additional memory modules 926, a power supply 930, and/or a camera 932. The Bluetooth module 912, the WLAN module 914, and the satellite system module 916 may include an on-chip transceiver (TRX)/receiver (RX). The cellular baseband processor 924 communicates through the transceiver(s) 922 via one or more antennas 980 with the UE 104 and/or with an RU associated with a network entity 902. The cellular baseband processor 924 and the application processor 906 may each include a computer-readable medium/memory 924', 906', respectively. The additional memory modules 926 may also be considered a computer-readable medium/memory. Each computer-readable medium/memory 924', 906', 926 may be non-transitory. The cellular baseband processor 924 and the application processor 906 are each responsible for general processing, including the execution of software stored on the computer-readable medium/memory. The software, when executed by the cellular baseband processor 924/application processor 906, causes the cellular baseband processor 924/application processor 906 to perform the various functions described herein. The computer-readable medium/memory may also be used for storing data that is manipulated by the cellular baseband processor 924/application processor 906 when executing software. The cellular baseband processor 924/application processor 906 may be a component of the UE 350 and may include the memory 360 and/or at least one of the TX processor 368, the RX processor 356, and the controller/processor 359. In one configuration, the apparatus 904 may be a processor chip (modem and/or application) and include just the cellular baseband processor 924 and/or the application processor 906, and in another configuration, the apparatus 904 may be the entire UE (e.g., see 350 of FIG. 3) and include the additional modules of the apparatus 904.

As discussed herein, the decoding component 198 may be configured to receive a communication from a second network entity via a channel, where the communication is encoded based on multi-level coding associated with at least a first coding level and a second coding level, and where the first coding level is associated with a first set of bits and the second coding level is associated with a second set of bits. In some aspects, the decoding component 198 may be further configured to generate a first estimate of a first log-likelihood ratio (LLR) associated with the first coding level, a second estimate of a second LLR associated with the second coding level, and auxiliary information including a third estimate of a third LLR based on the first set of bits and the second set of bits. In some aspects, the decoding component 198 may be further configured to decode the first set of bits based on the first estimate of the first LLR. In some aspects, the decoding component 198 may be further configured to generate a fourth estimate of the second LLR based on the decoded first set of bits, the second estimate of the second LLR, and the auxiliary information. In some aspects, the decoding component 198 may be further configured to decode the second set of bits based on the fourth estimate of the second LLR. The decoding component 198 may be within the cellular baseband processor 924, the application processor 906, or both the cellular baseband processor 924 and the application processor 906. The decoding component 198 may be one or more hardware components specifically configured to carry out the stated processes/algorithm, implemented by one or more processors configured to perform the stated processes/algorithm, stored within a computer-readable medium for implementation by one or more processors, or some combination thereof. As shown, the apparatus 904 may include a variety of components configured for various functions. In one configuration, the apparatus 904, and in particular the cellular baseband processor 924 and/or the application processor 906, includes means for receiving a communication from a second network entity via a channel, where the communication is encoded based on multi-level coding associated with at least a first coding level and a second coding level, and where the first coding level is associated with a first set of bits and the second coding level is associated with a second set of bits. In some aspects, the apparatus 904 may further include means for generating a first estimate of a first LLR associated with the first coding level, a second estimate of a second LLR associated with the second coding level, and auxiliary information including a third estimate of a third LLR based on the first set of bits and the second set of bits. In some aspects, the apparatus 904 may further include means for decoding the first set of bits based on the first estimate of the first LLR. In some aspects, the apparatus 904 may further include means for generating a fourth estimate of the second LLR based on the decoded first set of bits, the second estimate of the second LLR, and the auxiliary information. In some aspects, the apparatus 904 may further include means for decoding the second set of bits based on the fourth estimate of the second LLR. The means may be the decoding component 198 of the apparatus 904 configured to perform the functions recited by the means. As described herein, the apparatus 904 may include the TX processor 368, the RX processor 356, and the controller/processor 359. As such, in one configuration, the means may be the TX processor 368, the RX processor 356, and/or the controller/processor 359 configured to perform the functions recited by the means.

Figure 10:
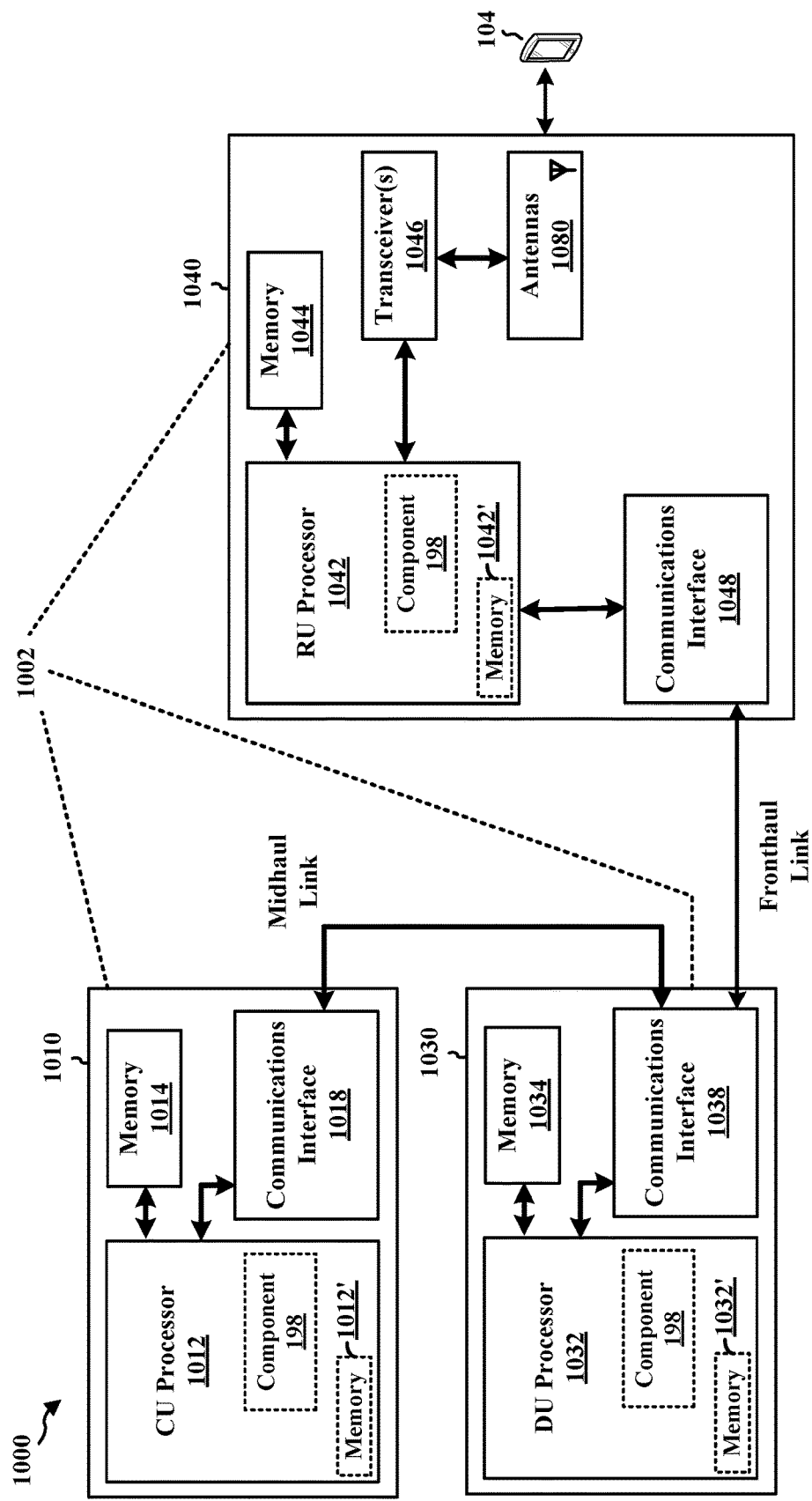
FIG. 10 is a diagram illustrating an example of a hardware implementation for an example network entity.

FIG. 10 is a diagram 1000 illustrating an example of a hardware implementation for a network entity 1002. The network entity 1002 may be a BS, a component of a BS, or may implement BS functionality. The network entity 1002 may include at least one of a CU 1010, a DU 1030, or an RU 1040. For example, depending on the layer functionality handled by the component 198, the network entity 1002 may include the CU 1010; both the CU 1010 and the DU 1030; each of the CU 1010, the DU 1030, and the RU 1040; the DU 1030; both the DU 1030 and the RU 1040; or the RU 1040. The CU 1010 may include a CU processor 1012. The CU processor 1012 may include on-chip memory 1012'. In some aspects, the CU 1010 may further include additional memory modules 1014 and a communications interface 1018. The CU 1010 communicates with the DU 1030 through a midhaul link, such as an F1 interface. The DU 1030 may include a DU processor 1032. The DU processor 1032 may include on-chip memory 1032'. In some aspects, the DU 1030 may further include additional memory modules 1034 and a communications interface 1038. The DU 1030 communicates with the RU 1040 through a fronthaul link. The RU 1040 may include an RU processor 1042. The RU processor 1042 may include on-chip memory 1042'. In some aspects, the RU 1040 may further include additional memory modules 1044, one or more transceivers 1046, antennas 1080, and a communications interface 1048. The RU 1040 communicates with the UE 104. The on-chip memory 1012', 1032', 1042' and the additional memory modules 1014, 1034, 1044 may each be considered a computer-readable medium/memory. Each computer-readable medium/memory may be non-transitory. Each of the processors 1012, 1032, 1042 is responsible for general processing, including the execution of software stored on the computer-readable medium/memory. The software, when executed by the corresponding processor(s) causes the processor(s) to perform the various functions described herein. The computer-readable medium/memory may also be used for storing data that is manipulated by the processor(s) when executing software.

As discussed herein, the decoding component 198 may be configured to receive a communication from a second network entity via a channel, where the communication is encoded based on multi-level coding associated with at least a first coding level and a second coding level, and where the first coding level is associated with a first set of bits and the second coding level is associated with a second set of bits. In some aspects, the decoding component 198 may be further configured to generate a first estimate of a first log-likelihood ratio (LLR) associated with the first coding level, a second estimate of a second LLR associated with the second coding level, and auxiliary information including a third estimate of a third LLR based on the first set of bits and the second set of bits. In some aspects, the decoding component 198 may be further configured to decode the first set of bits based on the first estimate of the first LLR. In some aspects, the decoding component 198 may be further configured to generate a fourth estimate of the second LLR based on the decoded first set of bits, the second estimate of the second LLR, and the auxiliary information. In some aspects, the decoding component 198 may be further configured to decode the second set of bits based on the fourth estimate of the second LLR. The decoding component 198 may be within one or more processors of one or more of the CU 1010, DU 1030, and the RU 1040. The decoding component 198 may be one or more hardware components specifically configured to carry out the stated processes/algorithm, implemented by one or more processors configured to perform the stated processes/algorithm, stored within a computer-readable medium for implementation by one or more processors, or some combination thereof. The network entity 1002 may include a variety of components configured for various functions. In one configuration, the network entity 1002 includes means for means for receiving a communication from a second network entity via a channel, where the communication is encoded based on multi-level coding associated with at least a first coding level and a second coding level, and where the first coding level is associated with a first set of bits and the second coding level is associated with a second set of bits. In some aspects, the network entity 1002 may further include means for generating a first estimate of a first LLR associated with the first coding level, a second estimate of a second LLR associated with the second coding level, and auxiliary information including a third estimate of a third LLR based on the first set of bits and the second set of bits. In some aspects, the network entity 1002 may further include means for decoding the first set of bits based on the first estimate of the first LLR. In some aspects, the network entity 1002 may further include means for generating a fourth estimate of the second LLR based on the decoded first set of bits, the second estimate of the second LLR, and the auxiliary information. In some aspects, the network entity 1002 may further include means for decoding the second set of bits based on the fourth estimate of the second LLR. The means may be the decoding component 198 of the network entity 1002 configured to perform the functions recited by the means. As described herein, the network entity 1002 may include the TX processor 316, the RX processor 370, and the controller/processor 375. As such, in one configuration, the means may be the TX processor 316, the RX processor 370, and/or the controller/processor 375 configured to perform the functions recited by the means.

Figure 11:
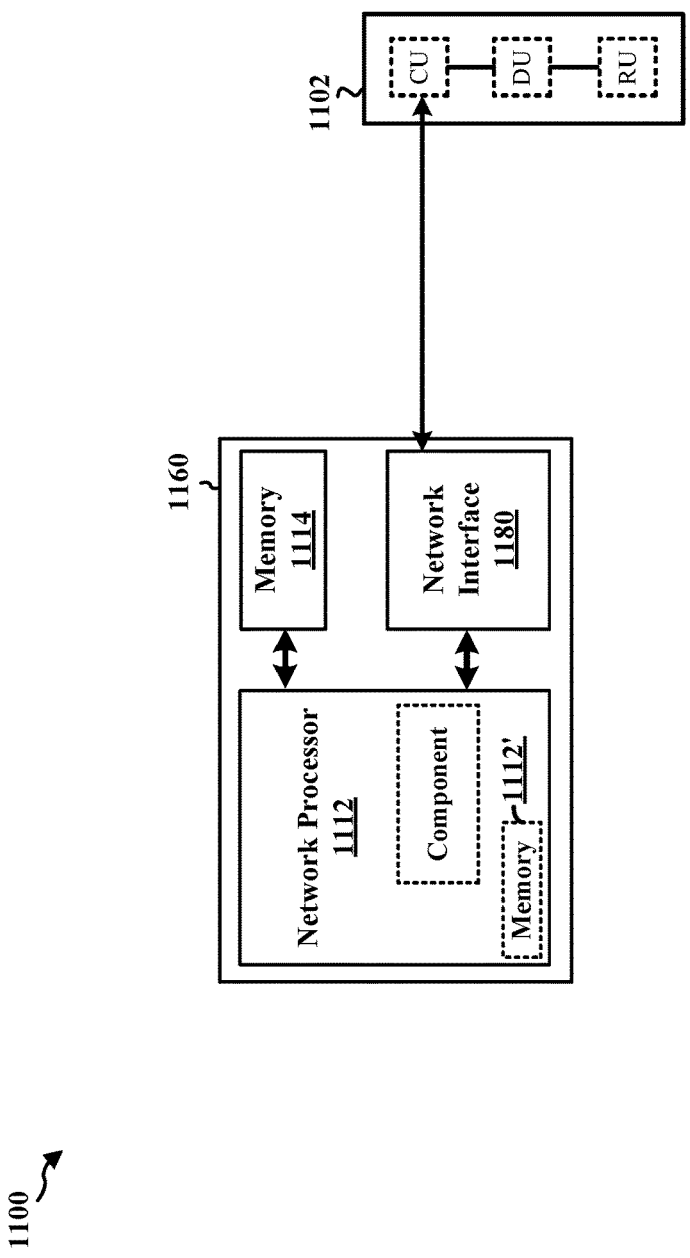
FIG. 11 is a diagram illustrating an example of a hardware implementation for a network entity.

FIG. 11 is a diagram 1100 illustrating an example of a hardware implementation for a network entity 1160. In one example, the network entity 1160 may be within the core network 120. The network entity 1160 may include a network processor 1112. The network processor 1112 may include on-chip memory 1112'. In some aspects, the network entity 1160 may further include additional memory modules 1114. The network entity 1160 communicates via the network interface 1180 directly (e.g., backhaul link) or indirectly (e.g., through a RIC) with the CU 1102. The on-chip memory 1112' and the additional memory modules 1114 may each be considered a computer-readable medium/memory. Each computer-readable medium/memory may be non-transitory. The processor 1112 is responsible for general processing, including the execution of software stored on the computer-readable medium/memory. The software, when executed by the corresponding processor(s) causes the processor(s) to perform the various functions described herein. The computer-readable medium/memory may also be used for storing data that is manipulated by the processor(s) when executing software.

As discussed herein, the decoding component 198 may be configured to receive a communication from a second network entity via a channel, where the communication is encoded based on multi-level coding associated with at least a first coding level and a second coding level, and where the first coding level is associated with a first set of bits and the second coding level is associated with a second set of bits. In some aspects, the decoding component 198 may be further configured to generate a first estimate of a first log-likelihood ratio (LLR) associated with the first coding level, a second estimate of a second LLR associated with the second coding level, and auxiliary information including a third estimate of a third LLR based on the first set of bits and the second set of bits. In some aspects, the decoding component 198 may be further configured to decode the first set of bits based on the first estimate of the first LLR. In some aspects, the decoding component 198 may be further configured to generate a fourth estimate of the second LLR based on the decoded first set of bits, the second estimate of the second LLR, and the auxiliary information. In some aspects, the decoding component 198 may be further configured to decode the second set of bits based on the fourth estimate of the second LLR. The component 198 may be within the processor 1112. The component 198 may be one or more hardware components specifically configured to carry out the stated processes/algorithm, implemented by one or more processors configured to perform the stated processes/algorithm, stored within a computer-readable medium for implementation by one or more processors, or some combination thereof. The network entity 1160 may include a variety of components configured for various functions. In one configuration, the network entity 1160 includes means for receiving a communication from a second network entity via a channel, where the communication is encoded based on multi-level coding associated with at least a first coding level and a second coding level, and where the first coding level is associated with a first set of bits and the second coding level is associated with a second set of bits. In some aspects, the network entity 1160 may further include means for generating a first estimate of a first LLR associated with the first coding level, a second estimate of a second LLR associated with the second coding level, and auxiliary information including a third estimate of a third LLR based on the first set of bits and the second set of bits. In some aspects, the network entity 1160 may further include means for decoding the first set of bits based on the first estimate of the first LLR. In some aspects, the network entity 1160 may further include means for generating a fourth estimate of the second LLR based on the decoded first set of bits, the second estimate of the second LLR, and the auxiliary information. In some aspects, the network entity 1160 may further include means for decoding the second set of bits based on the fourth estimate of the second LLR. The means may be the component 198 of the network entity 1160 configured to perform the functions recited by the means.

It is understood that the specific order or hierarchy of blocks in the processes/flowcharts disclosed is an illustration of example approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not limited to the aspects described herein, but are to be accorded the full scope consistent with the language claims. Reference to an element in the singular does not mean "one and only one" unless specifically so stated, but rather "one or more." Terms such as "if," "when," and "while" do not imply an immediate temporal relationship or reaction. That is, these phrases, e.g., "when," do not imply an immediate action in response to or during the occurrence of an action, but simply imply that if a condition is met then an action will occur, but without requiring a specific or immediate time constraint for the action to occur. The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. Sets should be interpreted as a set of elements where the elements number one or more. Accordingly, for a set of X, X would include one or more elements. If a first apparatus receives data from or transmits data to a second apparatus, the data may be received/transmitted directly between the first and second apparatuses, or indirectly between the first and second apparatuses through a set of apparatuses. All structural and functional equivalents to the elements of the various aspects described throughout this disclosure that are known or later come to be known to those of ordinary skill in the art are expressly incorporated herein by reference and are encompassed by the claims. Moreover, nothing disclosed herein is dedicated to the public regardless of whether such disclosure is explicitly recited in the claims. The words "module," "mechanism," "element," "device," and the like may not be a substitute for the word "means."

As such, no claim element is to be construed as a means plus function unless the element is expressly recited using the phrase "means for."

As used herein, the phrase "based on" shall not be construed as a reference to a closed set of information, one or more conditions, one or more factors, or the like. In other words, the phrase "based on A" (where "A" may be information, a condition, a factor, or the like) shall be construed as "based at least on A" unless specifically recited differently.

The following aspects are illustrative only and may be combined with other aspects or teachings described herein, without limitation.

Aspect 1 is a first network entity for communication, including: a memory; and at least one processor coupled to the memory, where the at least one processor is configured to: receive a communication from a second network entity via a channel, where the communication is encoded based on multi-level coding associated with at least a first coding level and a second coding level, and where the first coding level is associated with a first set of bits and the second coding level is associated with a second set of bits; generate a first estimate of a first log-likelihood ratio (LLR) associated with the first coding level, a second estimate of a second LLR associated with the second coding level, and auxiliary information including a third estimate of a third LLR based on the first set of bits and the second set of bits; decode the first set of bits based on the first estimate of the first LLR; generate a fourth estimate of the second LLR based on the decoded first set of bits, the second estimate of the second LLR, and the auxiliary information; and decode the second set of bits based on the fourth estimate of the second LLR.

Aspect 2 is the first network entity of aspect 1, where the third estimate of the third LLR is based on an exclusive disjunction (XOR) of the first set of bits and the second set of bits.

Aspect 3 is the first network entity of any of aspects 1-2, where the third estimate of the third LLR is based on an exclusive disjunction (XOR) of a first bit in the first set of bits and a second bit in the second set of bits.

Aspect 4 is the first network entity of any of aspects 1-3, where the third estimate of the third LLR is based on an exclusive disjunction (XOR) of a first one or more bits in the first set of bits and a second one or more bits in the second set of bits.

Aspect 5 is the first network entity of any of aspects 1-4, where the first one or more bits correspond to the first set of bits or a first subset of the first set of bits, and where the second one or more bits correspond to the second set of bits or a second subset of the second subset of bits.

Aspect 6 is the first network entity of any of aspects 1-5, where the first one or more bits of the first subset of bits and the second one or more bits of the second subset of bits are selected such that the XOR achieve a same value for at least one pair of constellations in which a bit differs.

Aspect 7 is the first network entity of any of aspects 1-6, where the pair of constellations have a minimum distance among all constellations in a set of modulation constellations associated with the communication.

Aspect 8 is the first network entity of any of aspects 1-7, where the auxiliary information includes a fifth estimate of a fifth LLR based on the first set of bits and the second set of bits, where the third estimate of the third LLR is based on a first exclusive disjunction of a first one or more bits in the first set of bits and a second one or more bits the second set of bits, and where the fifth estimate of the fifth LLR is based on a second exclusive disjunction of a third one or more bits in the first set of bits and a fourth one or more bits the second set of bits, where the first one or more bits is different from the third one or more bits or the second one or more bits is different from the fourth one or more bits.

Aspect 9 is the first network entity of any of aspects 1-8, where the fourth estimate of the second LLR is based on a sum of (1) the second estimate of the second LLR and (2) negative one to a power of the decoded first set of bits multiplied by the third estimate of the third LLR.

Aspect 10 is the first network entity of any of aspects 1-9, where the auxiliary information is based on a standard log-map or a maximum-log-map based on exclusive disjunction (XOR) of a first one or more bits in the first set of bits and a second one or more bits in the second set of bits.

Aspect 11 is a method of wireless communication for implementing any of aspects 1 to 10.

Aspect 12 is an apparatus for wireless communication including means for implementing any of aspects 1 to 10.

Aspect 13 is a computer-readable medium storing computer executable code, where the code when executed by a processor causes the processor to implement any of aspects 1 to 10.

What is claimed is:

1. A first network entity, comprising:
   a memory; and
   at least one processor coupled to the memory, wherein the at least one processor is configured to:
      receive a communication from a second network entity via a channel, wherein the communication is encoded based on multi-level coding associated with at least a first coding level and a second coding level, and wherein the first coding level is associated with a first set of bits and the second coding level is associated with a second set of bits;
      generate a first estimate of a first log-likelihood ratio (LLR) associated with the first coding level, a second estimate of a second LLR associated with the second coding level, and auxiliary information comprising a third estimate of a third LLR based on the first set of bits and the second set of bits;
      decode the first set of bits based on the first estimate of the first LLR;
      generate a fourth estimate of the second LLR based on the decoded first set of bits, the second estimate of the second LLR, and the auxiliary information; and
      decode the second set of bits based on the fourth estimate of the second LLR.

2. The first network entity of claim 1, wherein the third estimate of the third LLR is based on an exclusive disjunction (XOR) of the first set of bits and the second set of bits.

3. The first network entity of claim 1, wherein the third estimate of the third LLR is based on an exclusive disjunction (XOR) of a first bit in the first set of bits and a second bit in the second set of bits.

4. The first network entity of claim 1, wherein the third estimate of the third LLR is based on an exclusive disjunction (XOR) of a first one or more bits in the first set of bits and a second one or more bits in the second set of bits.

5. The first network entity of claim 4, wherein the first one or more bits correspond to the first set of bits or a first subset of the first set of bits, and wherein the second one or more bits correspond to the second set of bits or a second subset of the second subset of bits.

6. The first network entity of claim 5, wherein the first one or more bits of the first subset of bits and the second one or more bits of the second subset of bits are selected such that the XOR achieve a same value for at least one pair of constellations in which a bit differs.

7. The first network entity of claim 6, wherein the pair of constellations have a minimum distance among all constellations in a set of modulation constellations associated with the communication.

8. The first network entity of claim 1, wherein the auxiliary information comprises a fifth estimate of a fifth LLR based on the first set of bits and the second set of bits, wherein the third estimate of the third LLR is based on a first exclusive disjunction of a first one or more bits in the first set of bits and a second one or more bits the second set of bits, and wherein the fifth estimate of the fifth LLR is based on a second exclusive disjunction of a third one or more bits in the first set of bits and a fourth one or more bits the second set of bits, wherein the first one or more bits is different from the third one or more bits or the second one or more bits is different from the fourth one or more bits.

9. The first network entity of claim 1, wherein the fourth estimate of the second LLR is based on a sum of (1) the second estimate of the second LLR and (2) negative one to a power of the decoded first set of bits multiplied by the third estimate of the third LLR.

10. The first network entity of claim 1, wherein the auxiliary information is based on a standard log-map or a maximum-log-map based on exclusive disjunction (XOR) of a first one or more bits in the first set of bits and a second one or more bits in the second set of bits.

11. A method performed by a first network entity, comprising:
receiving a communication from a second network entity via a channel, wherein the communication is encoded based on multi-level coding associated with at least a first coding level and a second coding level, and wherein the first coding level is associated with a first set of bits and the second coding level is associated with a second set of bits;
generating a first estimate of a first log-likelihood ratio (LLR) associated with the first coding level, a second estimate of a second LLR associated with the second coding level, and auxiliary information comprising a third estimate of a third LLR based on the first set of bits and the second set of bits;
decoding the first set of bits based on the first estimate of the first LLR;
generating a fourth estimate of the second LLR based on the decoded first set of bits, the second estimate of the second LLR, and the auxiliary information; and
decoding the second set of bits based on the fourth estimate of the second LLR.

12. The method of claim 11, wherein the third estimate of the third LLR is based on an exclusive disjunction (XOR) of the first set of bits and the second set of bits.

13. The method of claim 11, wherein the third estimate of the third LLR is based on an exclusive disjunction (XOR) of a first bit in the first set of bits and a second bit in the second set of bits.

14. The method of claim 11, wherein the third estimate of the third LLR is based on an exclusive disjunction (XOR) of a first one or more bits in the first set of bits and a second one or more bits in the second set of bits.

15. The method of claim 14, wherein the first one or more bits correspond to the first set of bits or a first subset of the first set of bits, and wherein the second one or more bits correspond to the second set of bits or a second subset of the second subset of bits.

16. The method of claim 15, wherein the first one or more bits of the first subset of bits and the second one or more bits of the second subset of bits are selected such that the XOR achieve a same value for at least one pair of constellations in which a bit differs.

17. The method of claim 16, wherein the pair of constellations have a minimum distance among all constellations in a set of modulation constellations associated with the communication.

18. The method of claim 11, wherein the auxiliary information comprises a fifth estimate of a fifth LLR based on the first set of bits and the second set of bits, wherein the third estimate of the third LLR is based on a first exclusive disjunction of a first one or more bits in the first set of bits and a second one or more bits the second set of bits, and wherein the fifth estimate of the fifth LLR is based on a second exclusive disjunction of a third one or more bits in the first set of bits and a fourth one or more bits the second set of bits, wherein the first one or more bits is different from the third one or more bits or the second one or more bits is different from the fourth one or more bits.

19. The method of claim 11, wherein the fourth estimate of the second LLR is based on a sum of (1) the second estimate of the second LLR and (2) negative one to a power of the decoded first set of bits multiplied by the third estimate of the third LLR.

20. The method of claim 11, wherein the auxiliary information is based on a standard log-map or a maximum-log-map based on exclusive disjunction (XOR) of a first one or more bits in the first set of bits and a second one or more bits in the second set of bits.

21. An apparatus at a first network entity, comprising:
means for receiving a communication from a second network entity via a channel, wherein the communication is encoded based on multi-level coding associated with at least a first coding level and a second coding level, and wherein the first coding level is associated with a first set of bits and the second coding level is associated with a second set of bits;
means for generating a first estimate of a first log-likelihood ratio (LLR) associated with the first coding level, a second estimate of a second LLR associated with the second coding level, and auxiliary information comprising a third estimate of a third LLR based on the first set of bits and the second set of bits;
means for decoding the first set of bits based on the first estimate of the first LLR;
means for generating a fourth estimate of the second LLR based on the decoded first set of bits, the second estimate of the second LLR, and the auxiliary information; and
means for decoding the second set of bits based on the fourth estimate of the second LLR.

22. A non-transitory computer-readable medium having computer executable code stored thereon that, when executed by an apparatus, causes the apparatus to:
receive a communication from a second network entity via a channel, wherein the communication is encoded based on multi-level coding associated with at least a first coding level and a second coding level, and wherein the first coding level is associated with a first set of bits and the second coding level is associated with a second set of bits;
generate a first estimate of a first log-likelihood ratio (LLR) associated with the first coding level, a second estimate of a second LLR associated with the second coding level, and auxiliary information comprising a third estimate of a third LLR based on the first set of bits and the second set of bits;

decode the first set of bits based on the first estimate of the first LLR;

generate a fourth estimate of the second LLR based on the decoded first set of bits, the second estimate of the second LLR, and the auxiliary information; and decode the second set of bits based on the fourth estimate of the second LLR.

* * * * *